(12) United States Patent
Oyu

(10) Patent No.: US 7,687,351 B2
(45) Date of Patent: Mar. 30, 2010

(54) SEMICONDUCTOR DEVICE AND METHOD OF MANUFACTURING THE SAME

(75) Inventor: Kiyonori Oyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/327,932

(22) Filed: Dec. 4, 2008

(65) Prior Publication Data

US 2009/0148992 A1    Jun. 11, 2009

(30) Foreign Application Priority Data

Dec. 6, 2007  (JP) ............................. 2007-315747

(51) Int. Cl.
*H01L 21/336*  (2006.01)
*H01L 21/3205*  (2006.01)

(52) U.S. Cl. .................. 438/268; 438/269; 438/294; 438/586; 438/587; 257/E21.159; 257/E21.24

(58) Field of Classification Search .................. 438/268, 438/269, 294, 586, 587
See application file for complete search history.

(56) References Cited

U.S. PATENT DOCUMENTS 7,211,864 B2 * 5/2007 Seliskar .................. 257/347

2003/0151068 A1 * 8/2003 Ishibashi .................. 257/200
2004/0262681 A1   12/2004 Masuoka et al.
2005/0056892 A1 * 3/2005 Seliskar .................. 257/348
2007/0296045 A1 * 12/2007 Tanaka .................. 257/396

FOREIGN PATENT DOCUMENTS

JP       08-116068      5/1996
JP       2007-134593    5/2007

* cited by examiner

*Primary Examiner*—Alexander G Ghyka
(74) *Attorney, Agent, or Firm*—Young & Thompson

(57) ABSTRACT

A semiconductor device includes: a semiconductor substrate; multiple active regions of a first conductive type isolated from one another by shallow-trench isolation regions provided on one surface of the semiconductor substrate; multiple silicon pillars including channel silicon pillars formed in the active regions; multiple first semiconductor regions of a second conductive type that are respectively formed on bottom ends of the silicon pillars and to be sources or drains; multiple second semiconductor regions of the second conductive type that are formed on top ends of the silicon pillars and to be sources or drains; multiple gate insulating films surrounding the silicon pillars; and multiple gate electrodes surrounding the gate insulating films. At least one of the channel silicon pillars has a height different from that of another one of the channel silicon pillars.

6 Claims, 22 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and particularly to a semiconductor device including vertical MOS transistors of different channel lengths.

Priority is claimed on Japanese Patent Application No. 2007-315747, filed Dec. 6, 2007, the content of which is incorporated herein by reference.

2. Description of the Related Art

As shown in FIG. 2 of US Patent Application Publication No. 2004/0262681 A1, a conventional three-dimensional transistor, i.e., a vertical MOS transistor, includes a silicon pillar to be a channel between source-drain diffusion layers. The channel portion of the silicon pillar is surrounded by a gate insulating film and a gate electrode. The source-drain diffusion layers are formed on the silicon pillar so as to completely cover the channel portion.

In the vertical MOS transistor, an arrangement of vertical MOS transistors of different withstand voltages are not considered.

Japanese Unexamined Patent Application, First Publication No. 2007-134593 discloses a semiconductor device including two vertical transistors Tr1 in addition to a conventional planar MOS transistor Tr2. Each of the vertical transistors Tr1 includes second-conductive-type diffusion layers on the upper and lower portions of an island-type semiconductor layer, and gate electrodes on both sides of the island-type semiconductor layer through a gate insulating film.

However, these two vertical MOS transistors Tr1 have substantially the same structures and the same channel lengths. Therefore, a circuit design of the semiconductor device is restricted in some cases.

Japanese Unexamined Patent Application, First Publication No. H08-116068 discloses a semiconductor device including an n-channel MOSFET and a p-channel MOSFET. A first island-type layered body forming the n-channel MOSFET includes a first n-type silicon semiconductor layer, a second p-type silicon semiconductor layer, and a third n-type silicon semiconductor layer. A second island-type layered body forming the p-channel MOSFET includes the second p-type silicon semiconductor layer, the third n-type silicon semiconductor layer, and a fourth p-type silicon semiconductor layer. The first and the second island layered bodies have different heights. A thermal oxide film is formed over the first and the second island layered bodies. Gate electrodes are formed on both sides of each of the first and the second island layered bodies. The second p-type silicon semiconductor layer and the third n-type silicon semiconductor layer are used as source-and-drain regions and channel regions.

However, multiple semiconductor layers are included in the above structure, complicating manufacturing processes. Further, the thermal oxide film is so thin that insulation (isolation) is not sufficient. As a result, the gate capacitance stored in the second p-type silicon semiconductor layer and the third n-type silicon semiconductor layer increases, making current-voltage characteristics unstable in some cases.

Further, recent semiconductor devices require high density and low power consumption. However, a microscopic wiring or a contact arrangement design for high density and low power consumption cannot be performed in the structures disclosed in the above related arts.

SUMMARY

A semiconductor-device manufacturing method according to one aspect of the present invention may include: forming, on a surface of a semiconductor substrate, a plurality of active regions of a first conductive type isolated from one another by shallow-trench isolation regions; forming a plurality of silicon pillars including channel silicon pillars in the active regions with a silicon nitride film as a mask; forming first semiconductor regions of a second conductive type on bottom ends of the silicon pillars with the silicon nitride film remaining on the silicon pillars; forming a sacrificial insulating film by spin coating over the silicon pillars and the semiconductor substrate; removing the sacrificial insulating film on circumferences of the silicon pillars excluding the channel silicon pillars; forming capacitance-increase-prevention insulating films on portions where the sacrificial insulating film is removed to form gate-voltage-supply silicon pillars; removing residuals of the sacrificial insulating film; forming gate insulating films on circumferences of the channel silicon pillars; forming gate voltage-supply electrodes surrounding the capacitance-increase-prevention insulating films, and gate electrodes surrounding the gate insulating films so that the gate voltage-supply electrodes and the gate electrodes are connected; forming a first inter-layer insulating film over the gate voltage-supply electrodes and the gate electrodes; removing the silicon nitride film on a top end of at least one of the channel silicon pillars so as to expose the one of the channel silicon pillars; lowering a height of the one of the channel silicon pillars by etching; exposing top ends of the channel silicon pillars excluding the one of the channel silicon pillars; and forming second semiconductor regions of the second conductive type on the exposed top ends of the channel silicon pillars.

According to the present invention, a semiconductor device including transistors of different channel lengths can easily be manufactured. Thereby, design freedom can be improved and an increase in gate capacitance can be prevented.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated herein for explanatory purpose.

First Embodiment

Figure 1:
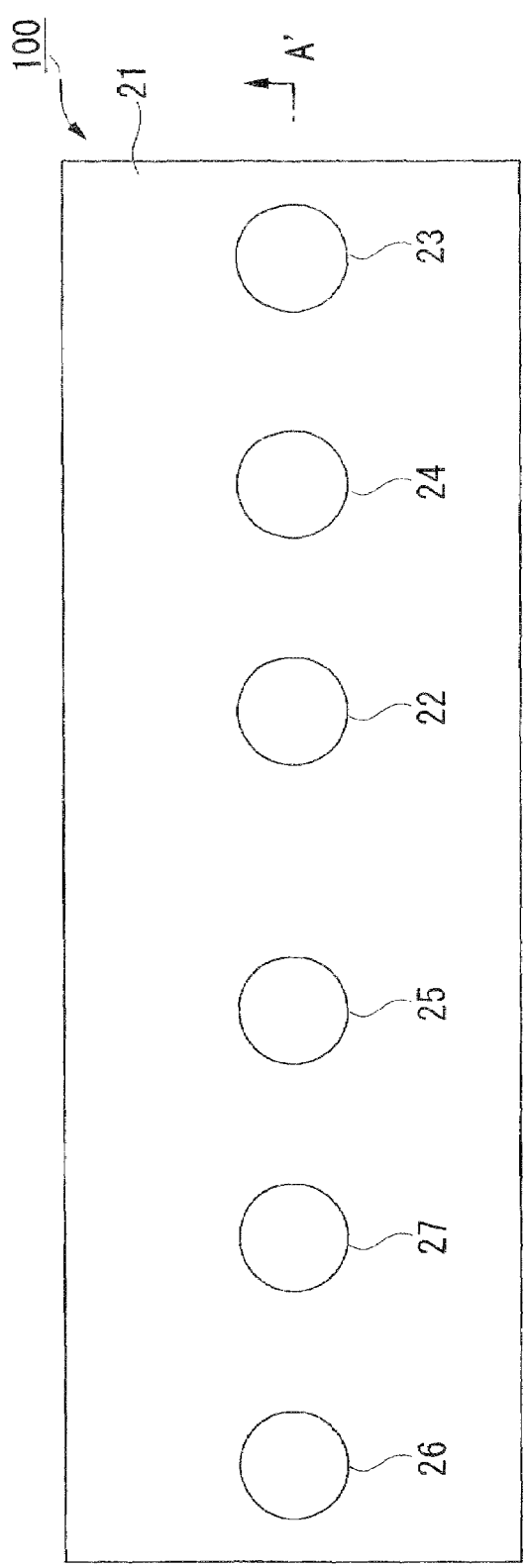
FIGS. 1 to 3 show cross-sectional views of a semiconductor device according to a first embodiment of the present invention.
Figure 2:
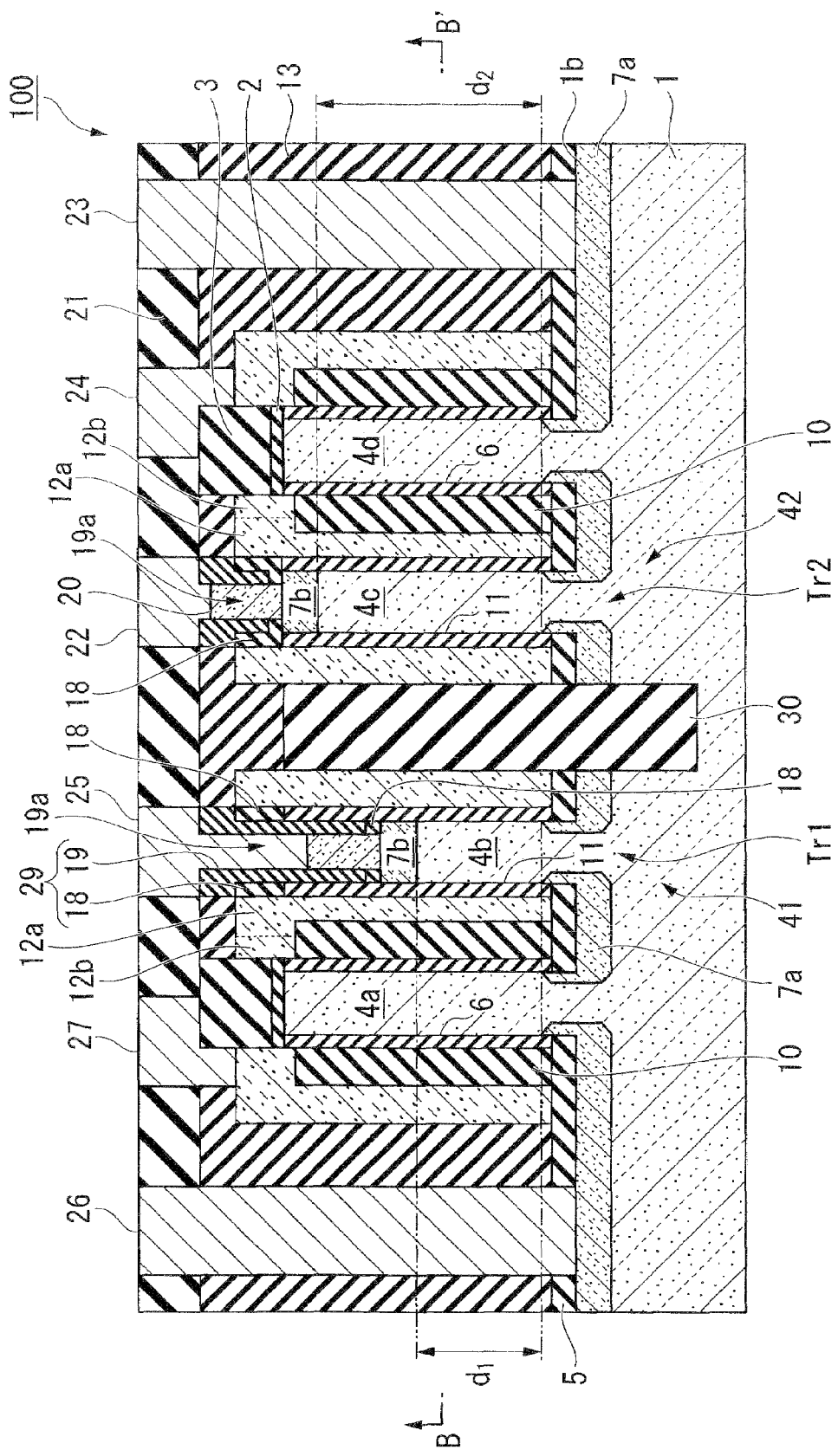
Figure 3:
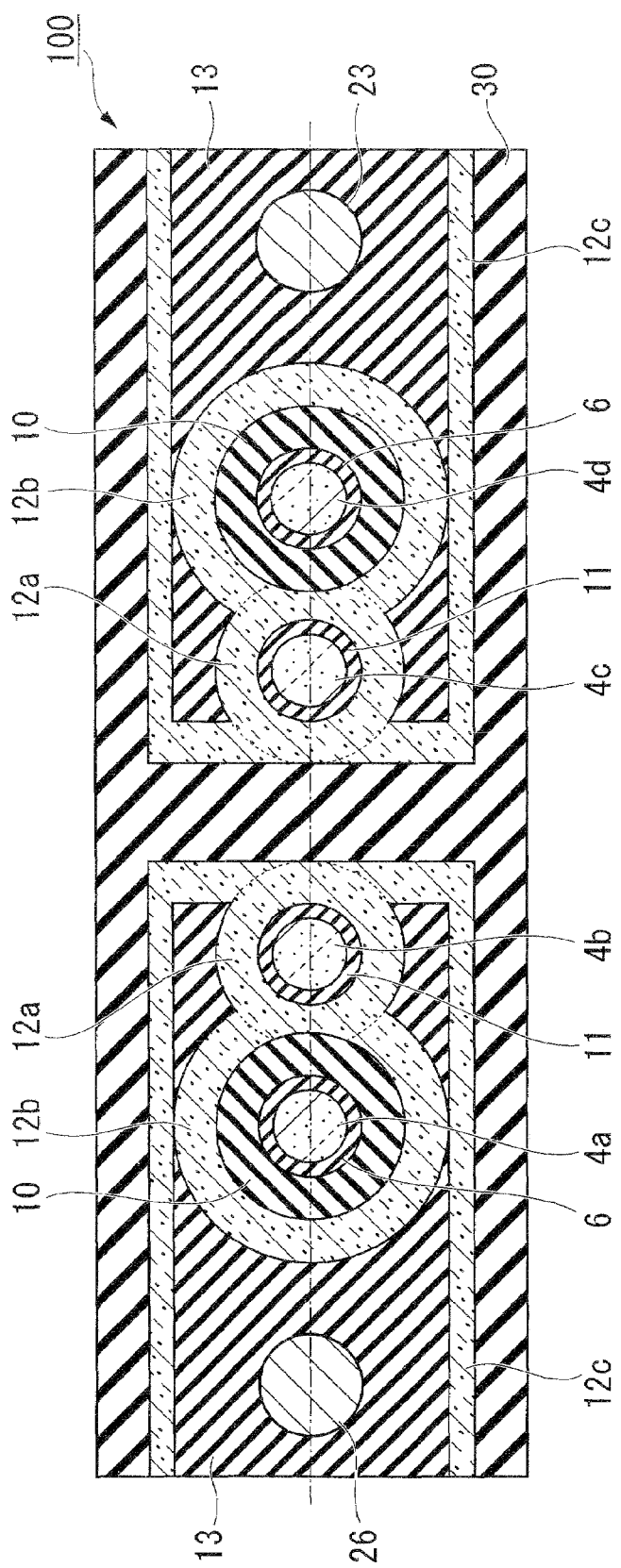

FIGS. 1 to 3 show an example of a semiconductor device according to a first embodiment of the present invention. FIG.

1 is a plane view, FIG. 2 is a cross-sectional view taken along an A-A' line shown in FIG. 1, and FIG. 3 is a cross-sectional view taken along a B-B' line shown in FIG. 2.

As shown in FIG. 1, circular contact-plug electrodes 22 to 27 arranged in series on a second inter-layer insulating film 21 are exposed when a semiconductor device 100 according to the first embodiment of the present invention is planarly viewed. The contact plug electrodes 22 to 27 are electrodes that supply current to sources, drains, and gates of vertical MOS transistors Tr1 and Tr2.

FIG. 2 is the cross-sectional view taken along the A-A' line shown in FIG. 1.

The semiconductor device 100 has a structure in which the vertical MOS transistors Tr1 and Tr2 are formed in first-conductive-type active regions 41 and 42 isolated from each other by a shallow-trench isolation region 30 provided on a semiconductor substrate 1. The first conductive type and a second conductive type are formed by injection (implantation) of n-type and p-type ions, respectively.

In the vertical MOS transistors Tr1 and Tr2, first semiconductor regions 7a of the second conductive type that will be sources and drains are arranged on the bottom end of channel silicon pillars 4b and 4c formed in the first-conductive-type active regions 41 and 42. Second semiconductor regions 7b of the second conductive type are arranged on the top end thereof. Gate insulating films 11 and gate electrodes 12a are arranged on the side surfaces of the channel silicon pillars 4b and 4c.

The first semiconductor regions 7a of the second conductive type formed in the active regions 41 and 42 of the first conductive type isolated from each other by the shallow-trench isolation region 30 are connected to the contact plug electrodes 26 and 23, respectively.

When voltages are applied to the contact plug electrodes 26 and 23, the voltages can be applied to the first semiconductor regions 7a of the second conductive type that will be sources or drains and formed on the bottom ends of the channel silicon pillars 4b and 4c.

The second semiconductor regions 7b of the second conductive type formed on the top ends of the channel silicon pillars 4b and 4c are connected to the contact plug electrodes 25 and 22 through epitaxial films 20, respectively.

When voltages are applied to the contact plug electrodes 25 and 22, the voltages can be applied to the second semiconductor regions 7b of the second conductive type that will be sources or drains and formed on the top ends of the channel silicon pillars 4b and 4c.

The epitaxial films 20 are formed so as to fill up holes 19a of cylindrical side spacers 19 to a given height.

Barrier layers 29 each including the cylindrical side spacer 19 and a silicon oxide film 18 are formed on the circumferences of the epitaxial films 20 and the contact plug electrodes 25 and 22 so as to insulate the epitaxial films 20 and the contact plug electrodes 25 and 22 from the gate electrodes 12a surrounding the channel silicon pillars 4b and 4c.

The gate insulating films 11 are formed so as to surround the channel silicon pillars 4b and 4c. The gate electrodes 12a are formed so as to surround the gate insulating films 11. The gate electrodes 12a are connected to gate voltage-supply electrodes 12b that are connected to the contact plug electrodes 27 and 24.

When voltages are applied to the contact plug electrodes 27 and 24, the voltages are applied to the gate electrodes 12a.

Gate-voltage-supply silicon pillars 4a and 4d are formed in the first-conductive-type active regions 41 and 42. A silicon oxide film 2 and a silicon nitride film 3 are formed on the top ends of the gate-voltage-supply silicon pillars 4a and 4d. As a result, insulation of the gate-voltage-supply silicon pillars 4a and 4d from the contact plugs 27 and 24 is ensured.

Insulating films 6 are formed so as to surround the side surfaces of the gate-voltage-supply silicon pillars 4a and 4d. Capacitance-increase-prevention insulating films 10 are formed so as to surround the insulating films 6. The gate voltage-supply electrodes 12b are formed so as to surround the capacitance-increase-prevention insulating films 10.

The capacitance-increase-prevention insulating films 10 are thicker than the insulating films 6. Thereby, insulation of gate voltage-supply electrodes 12b from the gate-voltage-supply silicon pillars 4a and 4d is maintained. Accordingly, an increase in gate capacitance can be prevented, and stable voltages can be supplied to the gate electrodes 12a surrounding the channel silicon pillars 4b and 4c.

Contact-plug holes are provided on the first and the second inter-layer insulating films 13 and 21, conductive materials are buried onto the contact-plug holes, thereby forming the contact plug electrodes 23 to 26.

The vertical MOS transistors Tr1 and Tr2 are formed to have the above structure. The distances between the first semiconductor regions 7a of the second conductive type and the second semiconductor regions 7b of the second conductive type that are of the channel silicon pillars 4b and 4c are set to d1 and d2, respectively.

Thus, vertical MOS transistors of different gate (channel) lengths can easily be obtained by heights of the channel silicon pillars 4b and 4c being changed. Therefore, design freedom can be enhanced, and high density and low power consumption can be achieved.

FIG. 3 is the cross-sectional view taken along the B-B' line shown in FIG. 2.

In the semiconductor device 100, two of the first inter-layer insulating films 13 in a rectangular shape are formed in parallel being surrounded by the shallow-trench isolation region 30. On the first inter-layer insulating films 13, two circular contact-plug electrodes 26 and 23, the channel silicon pillars 4b and 4c, and the gate voltage-supply pillars 4a and 4d are linearly arranged.

The channel silicon pillars 4b and 4c are formed across the shallow-trench isolation region 30 dividing the first inter-layer insulating film 13. The gate insulating films 11 are formed so as to surround the channel silicon pillars 4b and 4c. The gate electrodes 12a are formed so as to surround the gate insulating films 11.

The gate-voltage-supply silicon pillars 4a and 4d are formed across the shallow-trench isolation region 30 outside the channel silicon pillars 4b and 4c. The insulating films 6 are formed so as to surround the gate-voltage-supply silicon pillars 4a and 4d. The capacitance-increase-prevention insulating films 10 are formed so as to surround the insulating film 6. The gate voltage-supply electrodes 12b are formed so as to surround the capacitance-increase-prevention insulating films 10. The gate voltage-supply electrodes 12b are connected to the gate electrodes 12a formed so as to surround the silicon pillars 4b. Gate residual electrodes 12c are formed in contact with the shallow-trench isolation region 30.

In the semiconductor device 100, the channel silicon pillars 4b and 4c formed in the first-conductive-type active regions 41 and 42 have different heights. Therefore, vertical MOS transistors of different gate (channel) lengths can easily be obtained, design freedom can be enhanced, and high density and low power consumption can be achieved.

In the semiconductor device 100, the gate voltage-supply electrodes 12b are connected to the gate electrodes 12a surrounding the channel silicon pillars 4b and 4c, and the capacitance-increase-prevention insulating films 10 that are thicker than the insulting films 6 are provided between the gate electrodes 12a and the insulating films 6. Thereby, insulation of the gate voltage-supply electrodes 12b from the gate-voltage-supply silicon pillars 4a and 4d is ensured. Therefore, an increase in gate capacitance can be prevented, and stable voltages can be supplied to the gate electrodes 12a surrounding the channel silicon pillars 4b and 4c.

In the semiconductor device 100, the barrier layers 29 each including the side spacer 19 and the silicon oxide film 18 are formed on the circumferences of the contact plug electrodes 25 and 22 and the epitaxial layers 20. Thereby, insulation of the gate electrodes 12a from the contact plug electrodes 25 and 22 and the epitaxial film 20 is ensured. Therefore, voltages to be applied to the second semiconductor regions 7b of the second conductive type can stably be supplied, and characteristics of the vertical MOS transistors Tr1 and Tr2 can be stabilized.

Hereinafter, a method of manufacturing the semiconductor device 100 according to the first embodiment is explained.

The method of manufacturing the semiconductor device 100 includes processes of: forming the active regions, the shallow-trench isolation regions, and the silicon pillars; forming the first semiconductor regions; forming a sacrificial insulating layer by spin coating, e.g., SOG (Spin On Glass) after forming the insulating film; forming the gate-voltage-supply silicon pillars after forming the capacitance-increase-prevention insulating film; forming a gate insulating film after removing the sacrificial insulating film; forming the first inter-layer insulating film after forming the gate electrodes; lowering the height of at least one of the channel silicon pillars; forming the second semiconductor regions; forming the side spacers and the epitaxial silicon layers; and forming the contact plug electrodes.

In the process of forming the active regions, the shallow-trench isolation regions, and the silicon pillars, active regions made of p-type well layers are formed on the semiconductor substrate 1 made of silicon. Then, the shallow-trench isolation regions 30 are formed to divide the semiconductor substrate 1 into multiple first-conductive-type active regions. Only two active regions 41 and 42 of the first conductive type are shown in FIG. 4.

Figure 4:
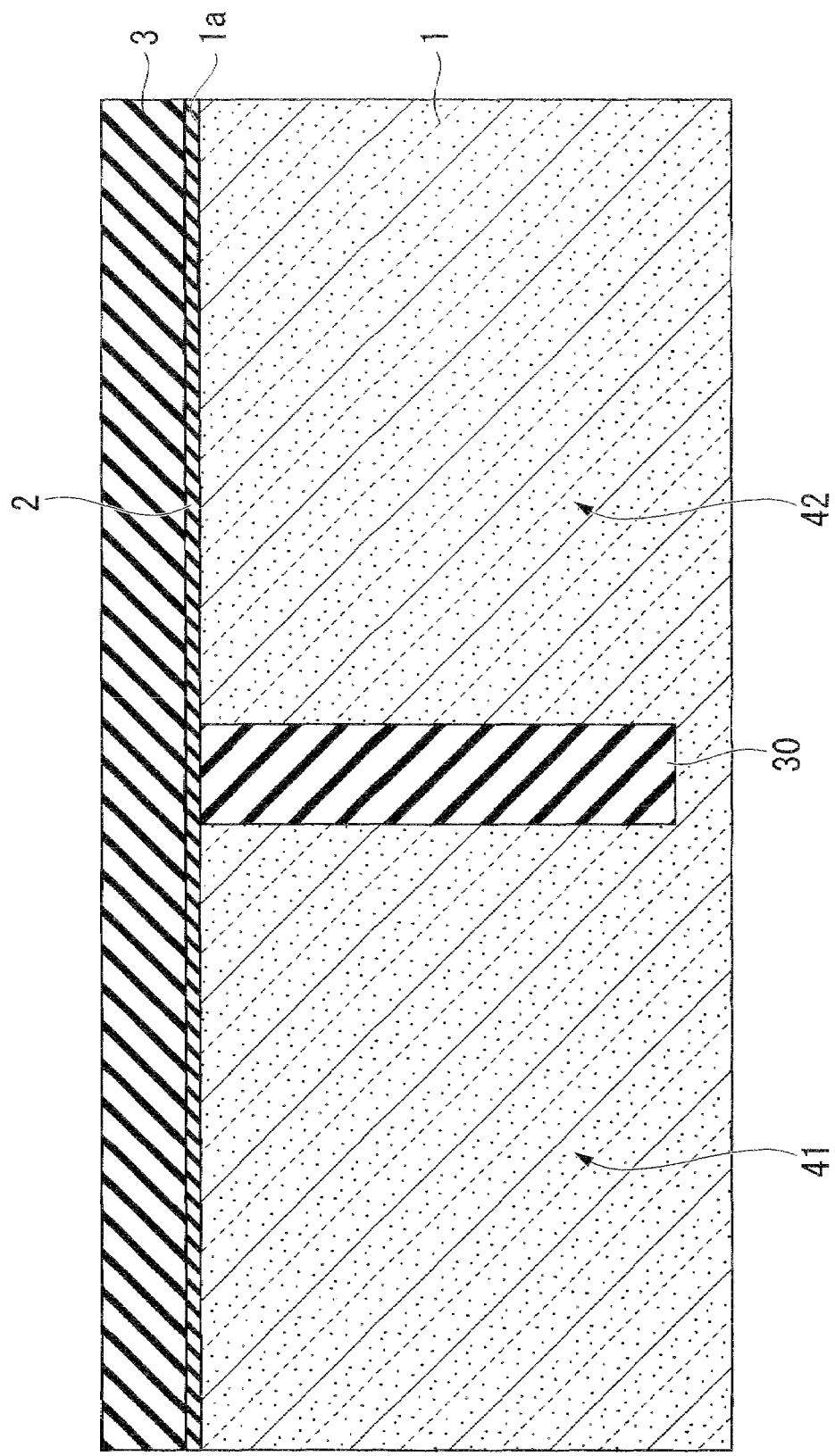
FIGS. 4 to 21 show sequential processes of a method of manufacturing the semiconductor device.

Then, the silicon oxide film 2 is formed over a surface 1a of the semiconductor substrate 1, and the silicon nitride film 3 is formed over the silicon oxide film 2 as shown in FIG. 4. The silicon oxide film 2 and the silicon nitride film 3 have thicknesses of, for example, 5 nm and 120 nm. The silicon oxide film 2 and the silicon nitride film 3 are formed by thermal oxidation and CVD (Chemical Vapor Deposition), respectively.

Figure 5:
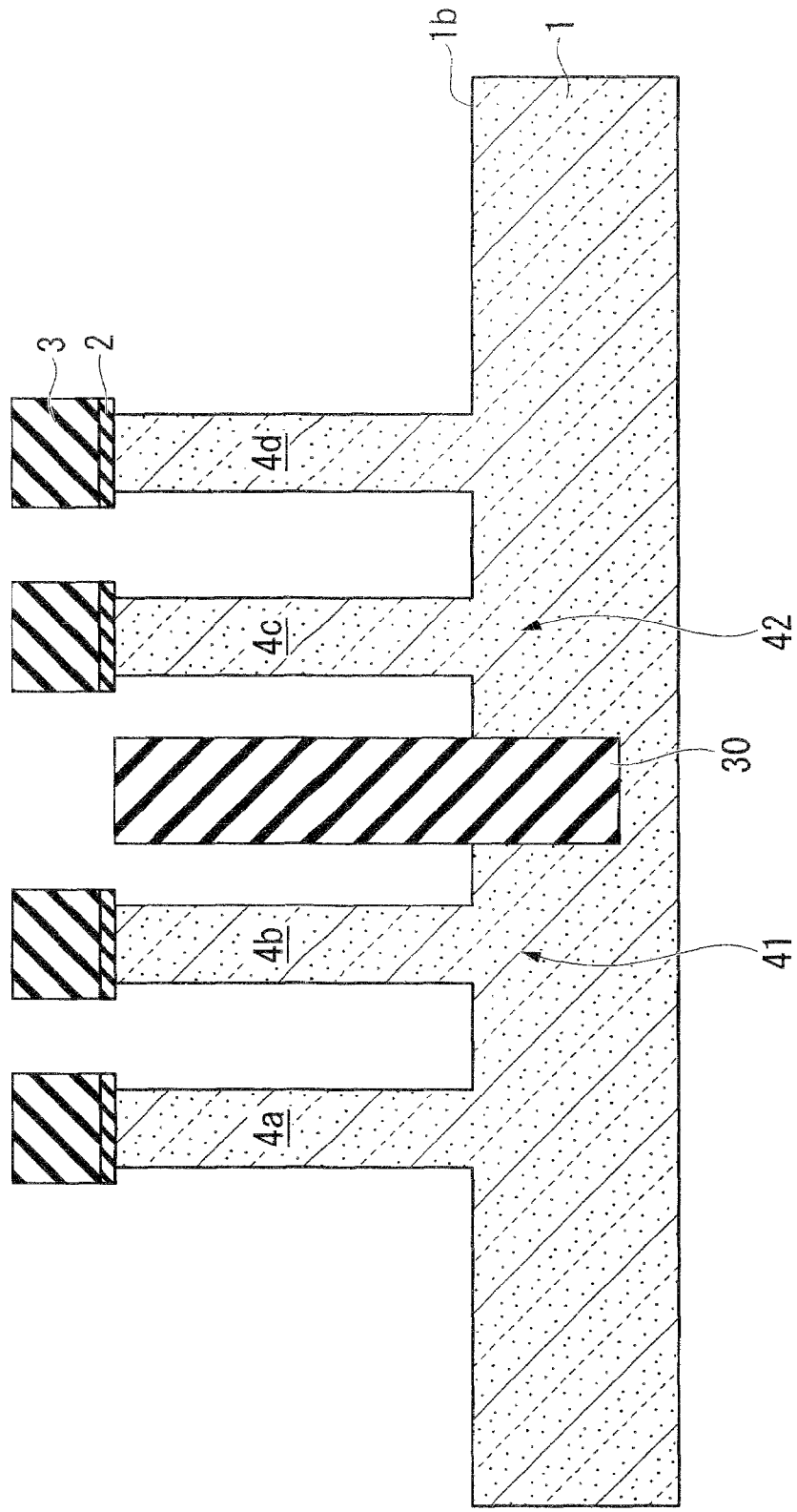

Then, the silicon nitride film 3 is patterned by lithography and dry-etching, the silicon oxide film 2 and the semiconductor substrate 1 are etched with the silicon nitride film 3 as a mask by dry-etching, and thereby the silicon pillars 4a, 4b, 4c, and 4d are formed as shown in FIG. 5. The bottom ends of the silicon pillars 4a to 4d on a surface of the semiconductor substrate 1 is a plane surface 1b.

Figure 6:
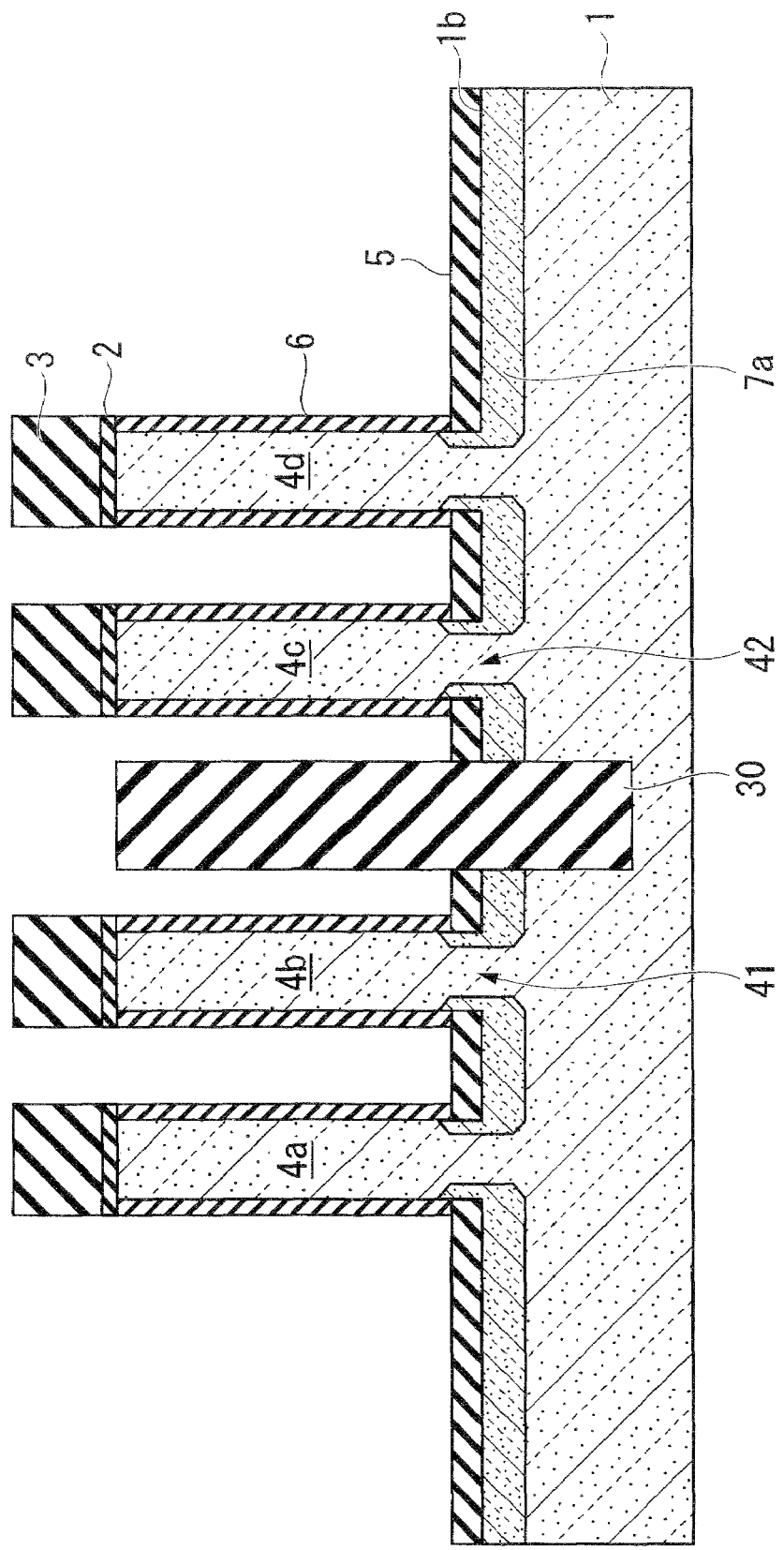

In the process of forming the insulating film after forming the first semiconductor regions, the first semiconductor regions 7a of the second conductive type that will be sources or drains are formed on the plane surface 1b of the semiconductor substrate 1 and the bottom ends of the silicon pillars 4a to 4d by ion-injection and thermal treatment as shown in FIG. 6. The second conductive type is an n-type.

Then, the silicon oxide film 5 is formed on the plane surface 1b of the semiconductor substrate 1 by CVD. The silicon oxide films 6 are formed on the side surfaces of the silicon pillars 4a to 4d by thermal oxidation.

Figure 7:
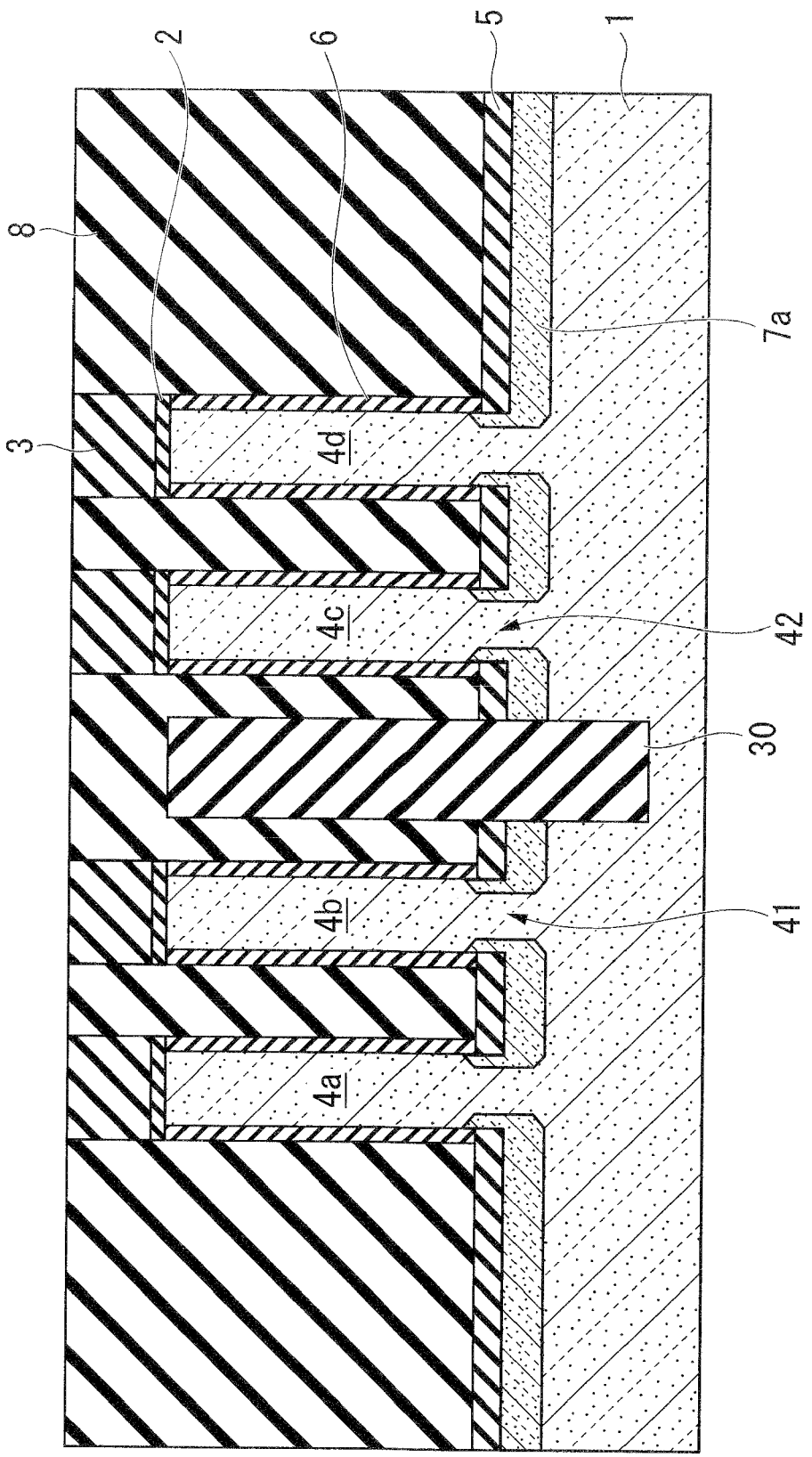

In the process of forming the sacrificial insulating film by SOG, a sacrificial insulating film 8 made of a silicon oxide film is deposited by SOG over the silicon oxide film 5 on the plane surface 1b of the silicon substrate 1 and the silicon pillars 4a to 4d as shown in FIG. 7.

Then, the surface of the sacrificial insulating film 8 is planarized by CMP (Chemical Mechanical Polishing) so as to expose the surface of the silicon nitride film 3.

Figure 8:
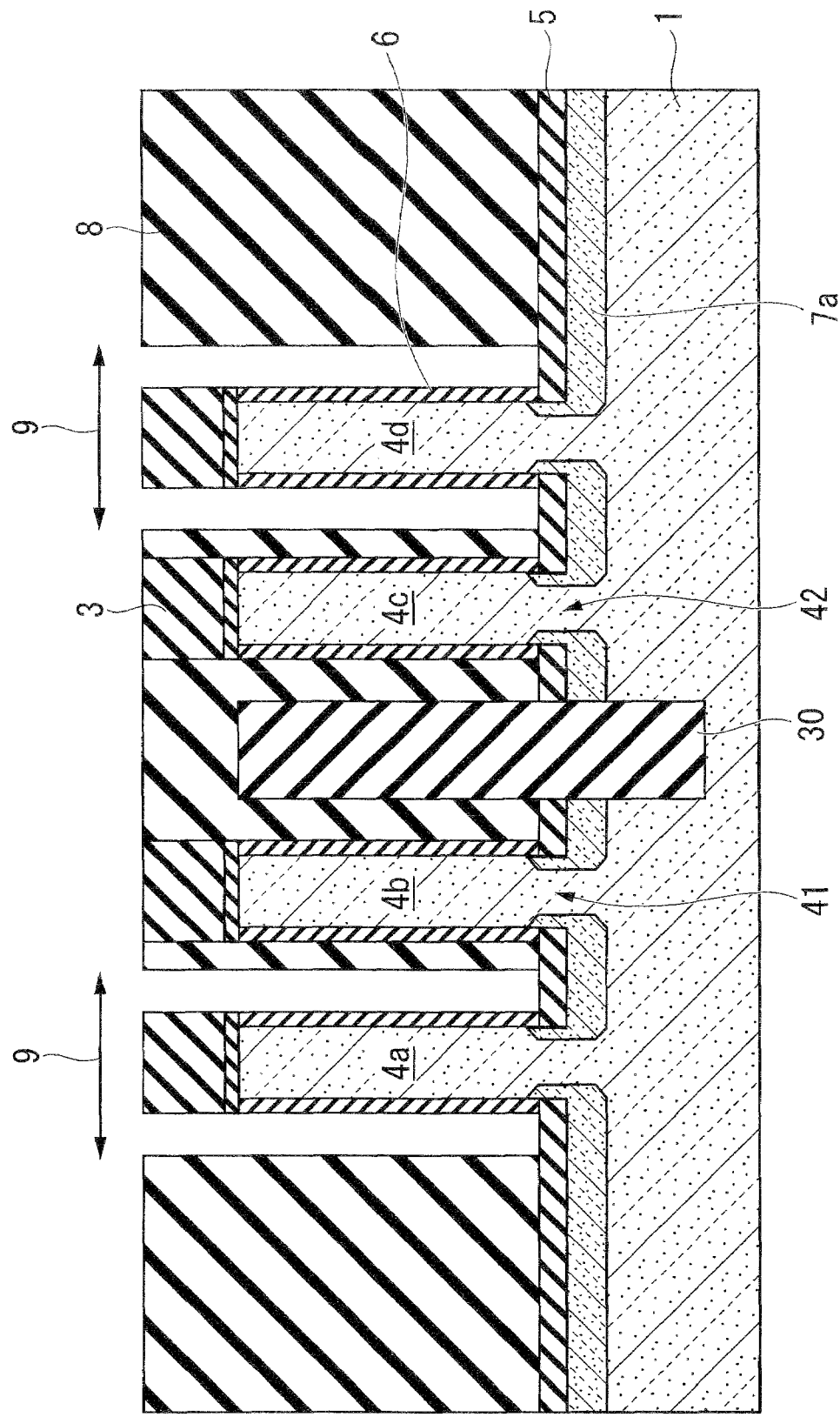

In the process of forming the gate-voltage-supply silicon pillars after forming the capacitance-increase-prevention insulating film, the sacrificial insulating film 8 on peripheral portions 9 of the gate-voltage-supply silicon pillars 4a and 4d is removed by lithography and dry-etching as shown in FIG. 8.

Figure 9:
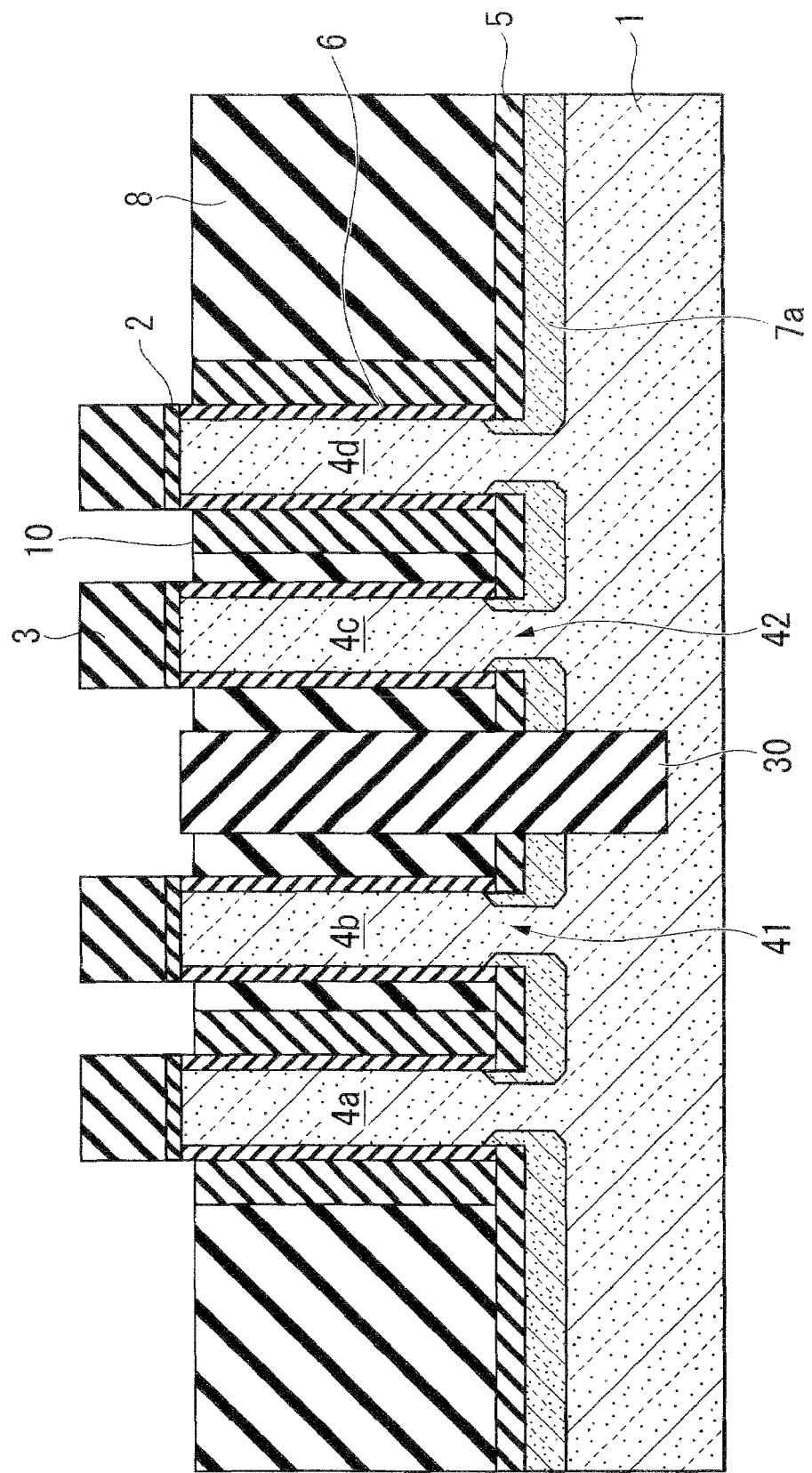

Then, the capacitance-increase-prevention insulating film 10 made of a silicon oxide film is formed by CVD so as to fill up the peripheral portions 9 where the sacrificial insulating film 8 has been removed as shown in FIG. 9.

Then, the sacrificial insulating film 8 and the capacitance-increase-prevention insulating film 10 are etched back with the silicon nitride film 3 as a mask so as to expose the shallow-trench isolation region 30.

Figure 10:
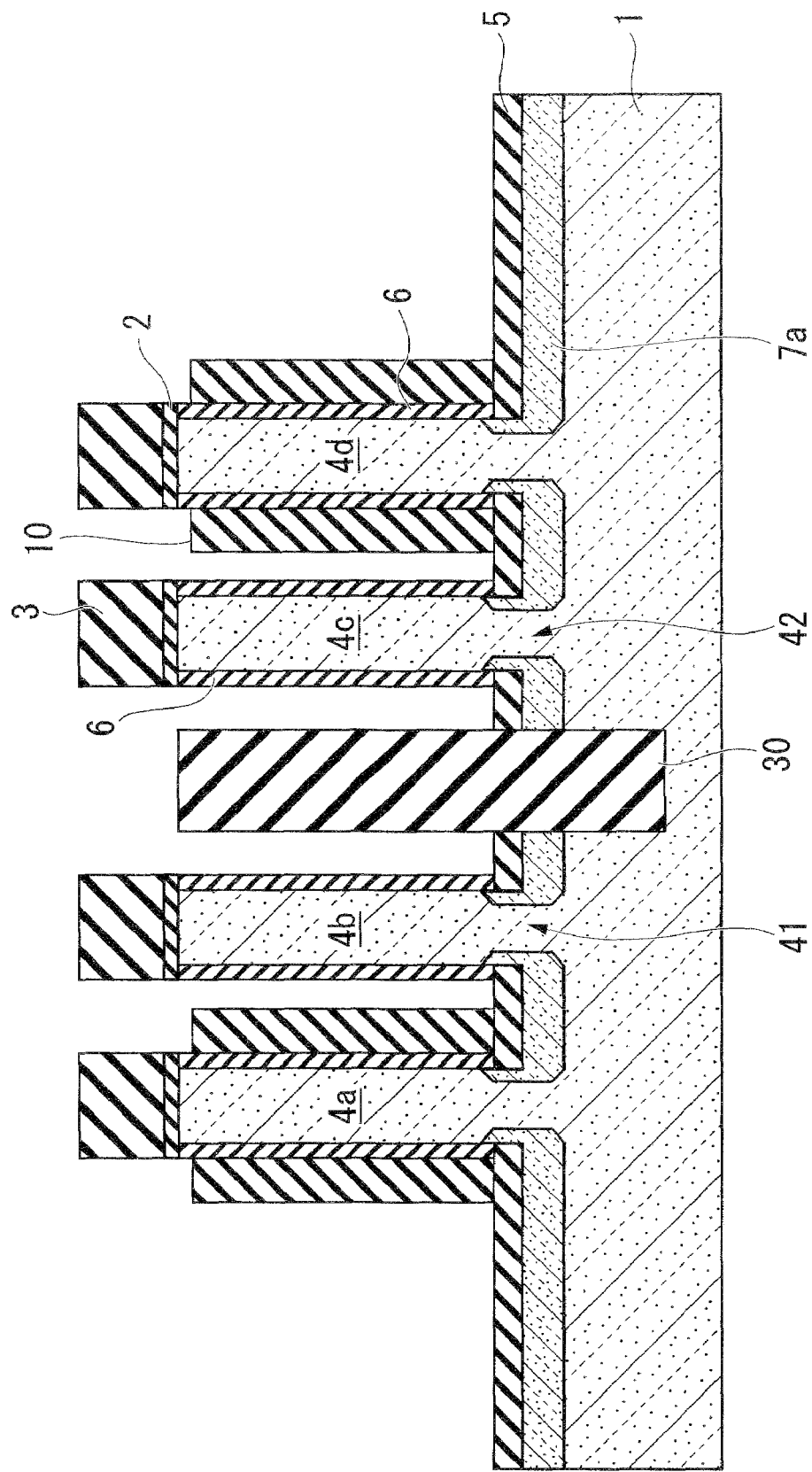

In the process of forming the gate insulating film after removing the sacrificial insulating film, the entire sacrificial insulating film 8 formed by SOG is removed using hydrofluoric acid as shown in FIG. 10.

The speed of etching, using hydrofluoric acid, the sacrificial insulating film 8 made of a silicon oxide film and formed by SOG is ten times faster than that of etching, using hydrofluoric acid, the silicon oxide film 6 formed by thermal oxidation, and the capacitance-increase-prevention insulating film 10 made of a silicon oxide film and formed by CVD.

For this reason, the silicon nitride film 3 and the silicon oxide film 5 that are formed by CVD, the silicon oxide film 6 formed by the thermal oxidation, and the capacitance-increase-prevention insulating film 10 made of a silicon oxide film and formed by CVD can remain almost as they are even after the entire sacrificial insulating film 8 is removed by the etching using the hydrofluoric acid.

Figure 11:
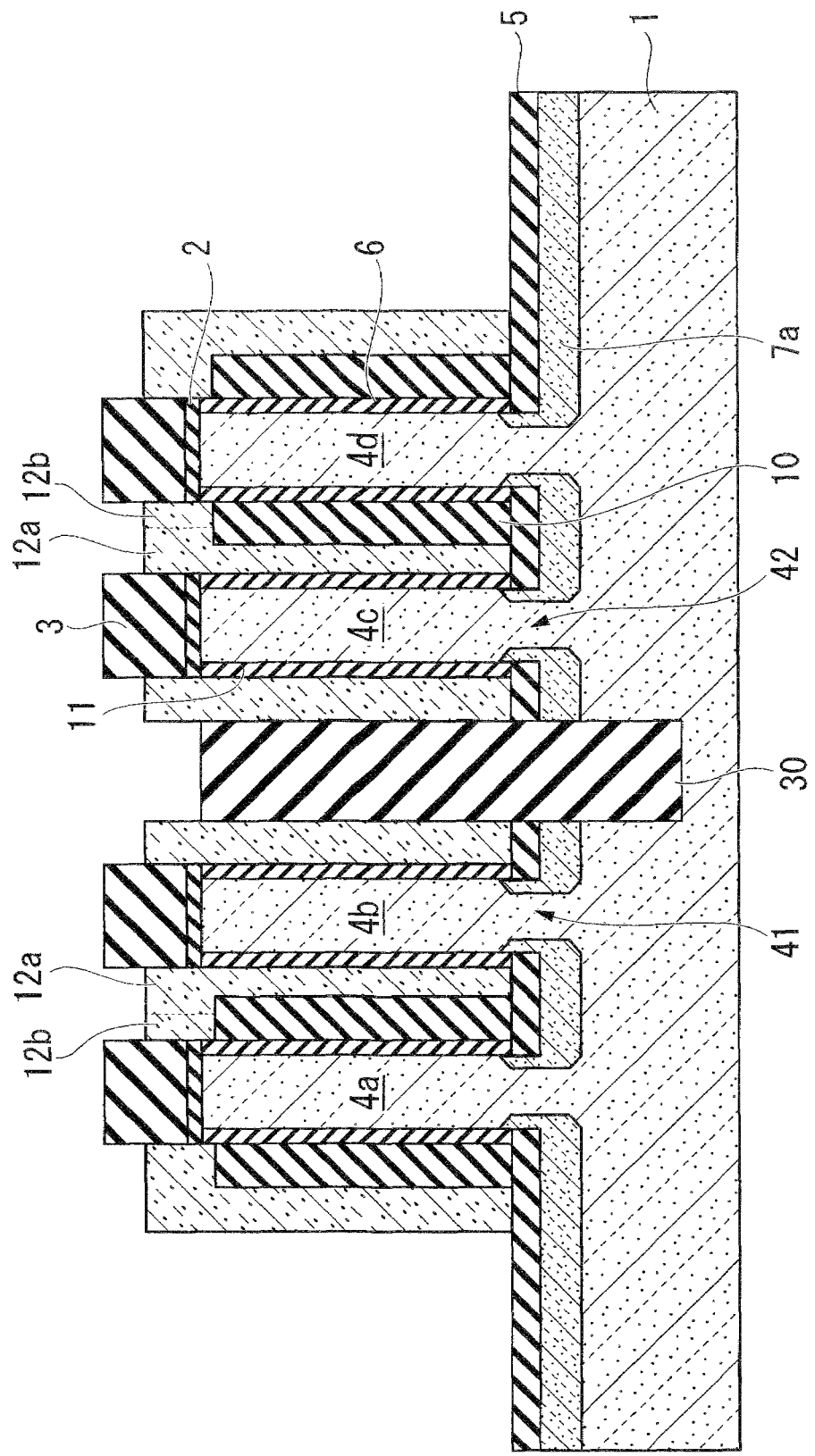

After the silicon oxide film 6 is removed, the gate insulating films 11 made of a silicon oxide film are formed on the side surfaces of the channel silicon pillars 4b and 4c by thermal oxidation as shown in FIG. 11.

In the process of forming the first inter-layer insulating film after forming the gate electrode, a gate electrode material, such as polysilicon, is deposited by CVD so as to surround the channel silicon pillars 4b and 4c, thereby forming the gate electrodes 12a. The gate voltage-supply electrodes 12b are formed so as to surround the gate-voltage-supply silicon pillars 4a and 4d. Then, the gate electrodes 12a and the gate voltage-supply electrodes 12b are connected.

Then, the gate electrodes 12a and the gate voltage-supply electrodes 12b are etched back so as to expose the half of the silicon nitride film 3 formed on the top ends of the silicon pillars 4a to 4d.

Figure 12:
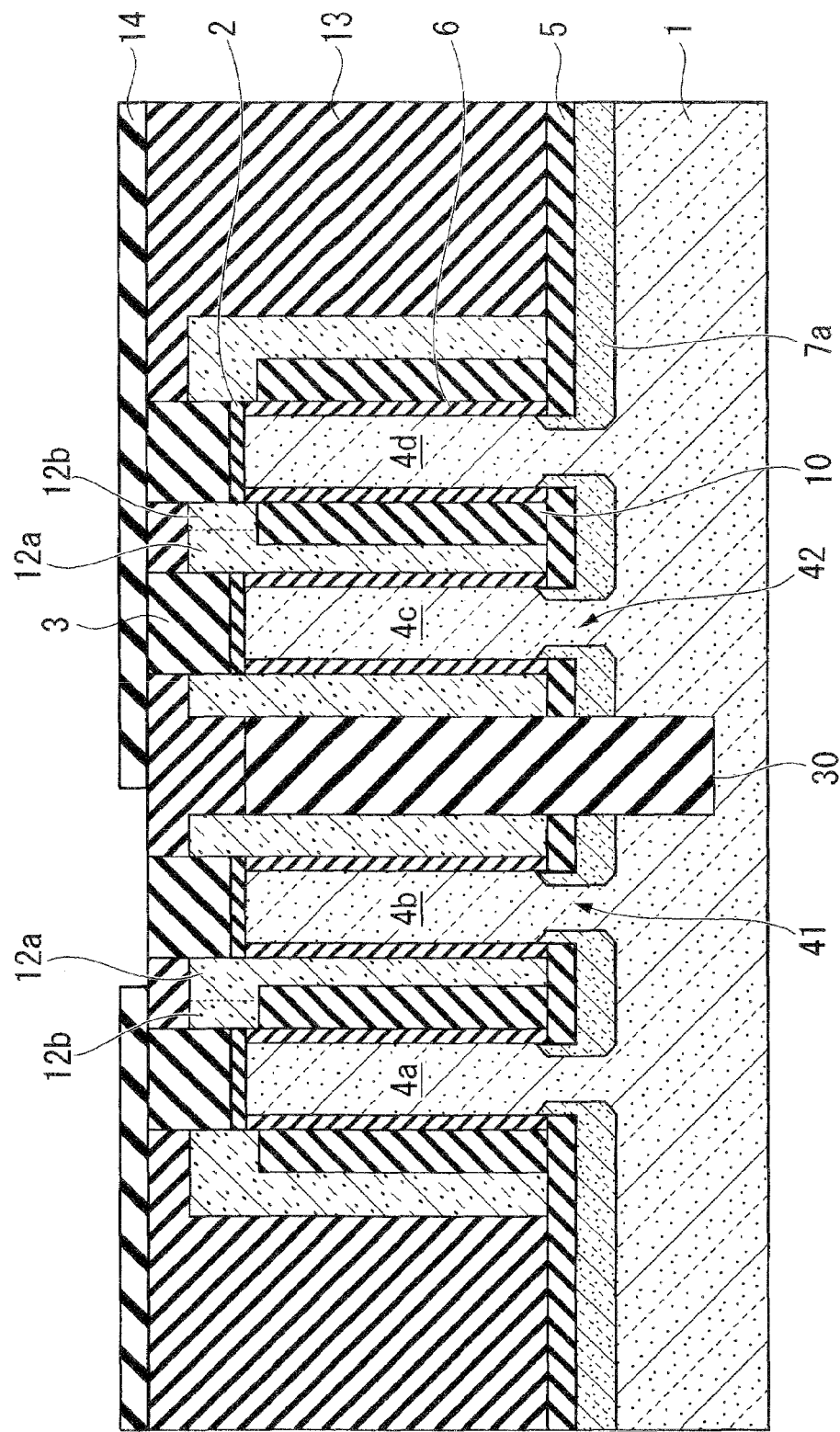

Then, the first inter-layer insulating film 13 is deposited by high-density plasma CVD and planarized by CMP so as to expose the silicon nitride film 3 as shown in FIG. 12.

In the process of lowering the height of at least one of the channel silicon pillars, the silicon oxide film 14 is formed over the first inter-layer insulating film 13 by plasma CVD. Then, the silicon oxide film 14 on the top end of the channel silicon pillar 4b is opened by lithography and dry-etching so as to expose the surface of the silicon nitride film 3 on the top end of the channel silicon pillar 4b.

Figure 13:
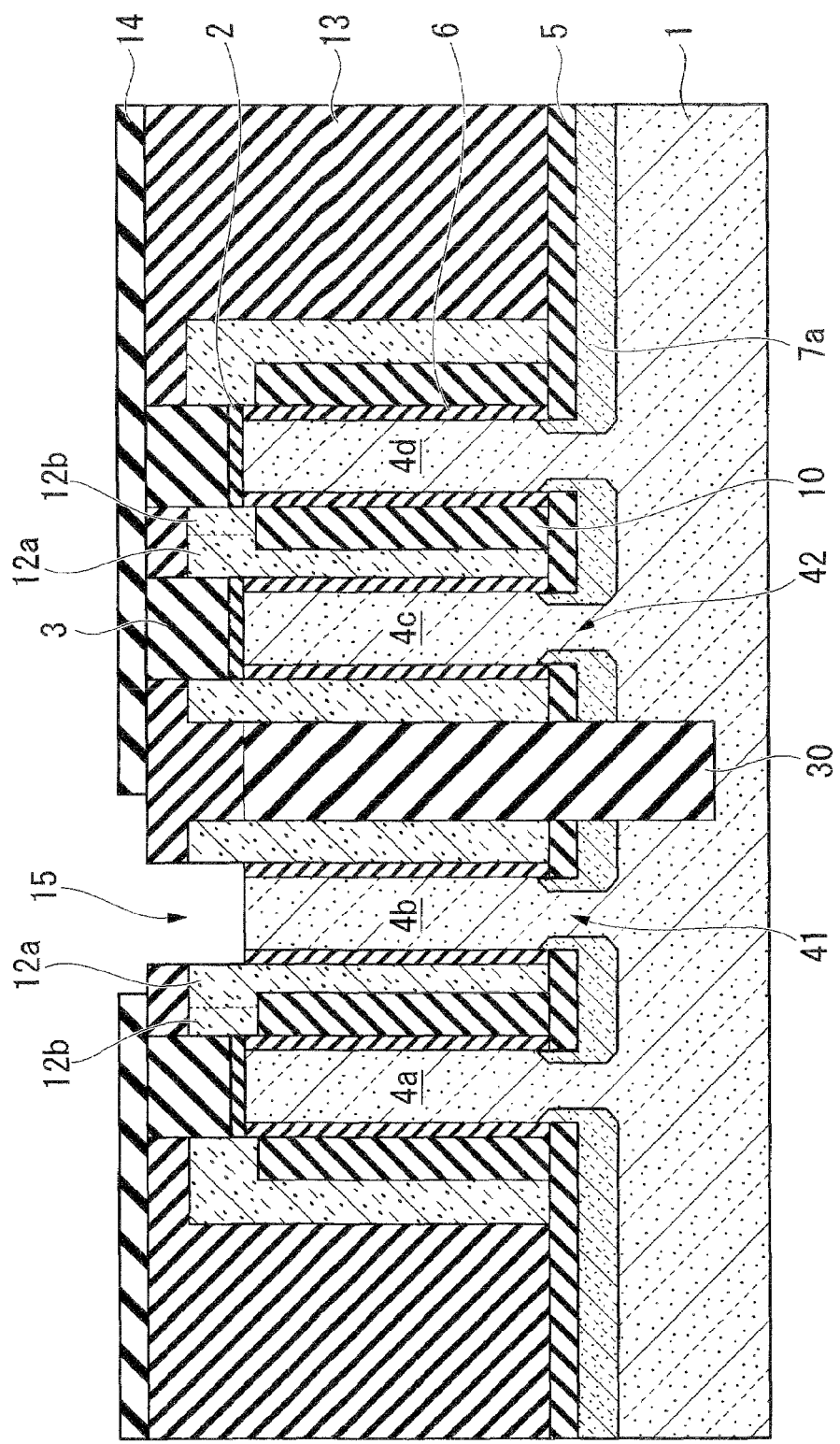

Then, the silicon nitride film 3 and the silicon oxide film 2 that are on the top end of the channel silicon pillar 4b are removed to form an opening 15 as shown in FIG. 13.

Figure 14:
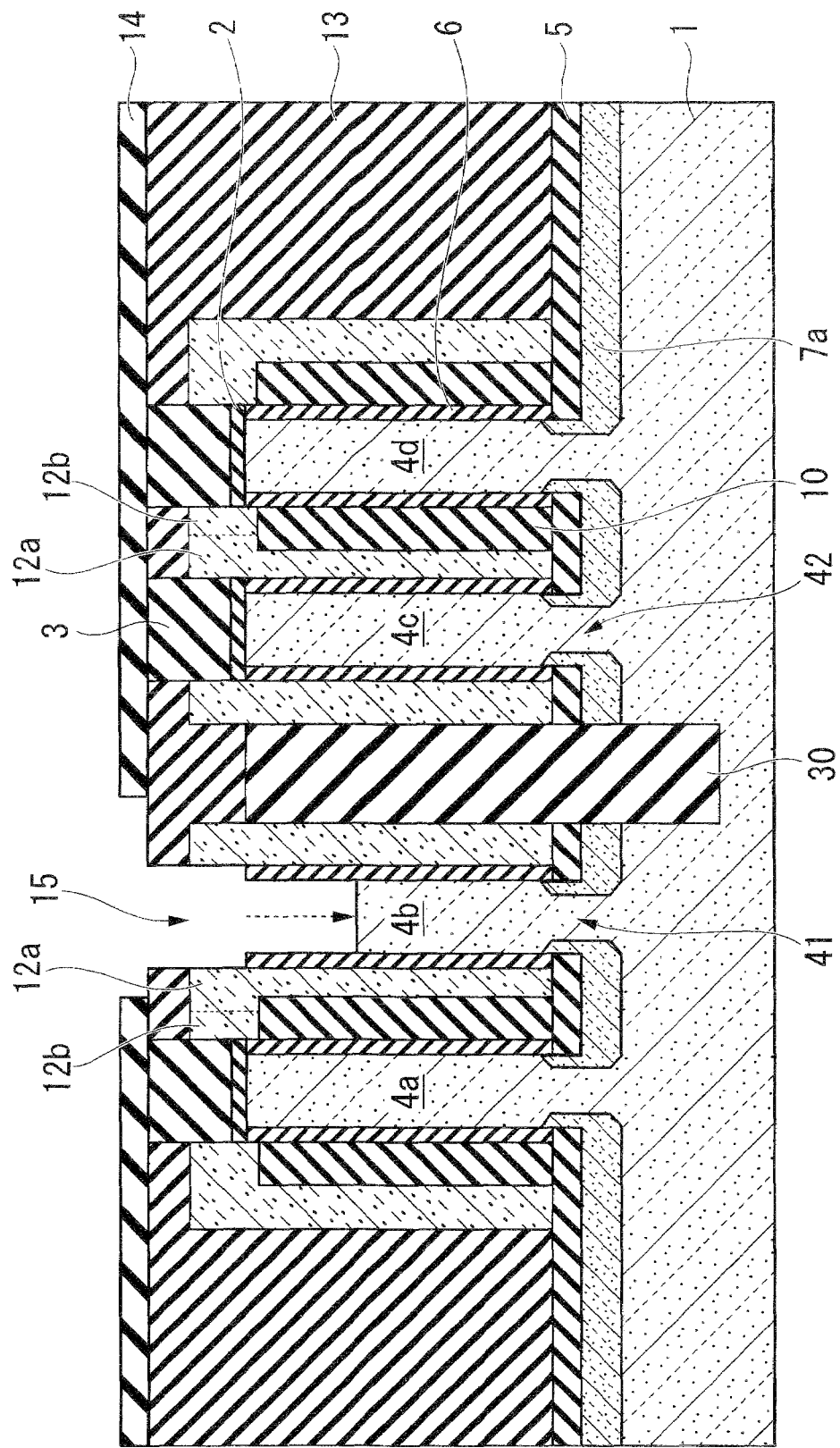

Then, dry-etching of silicon is performed from the top end of the exposed channel silicon pillar 4b to change the channel silicon pillar 4b in height to be lower than that of the other channel silicon pillar 4c, thereby forming the channel silicon pillar 4b of a different height as shown in FIG. 14.

Figure 15:
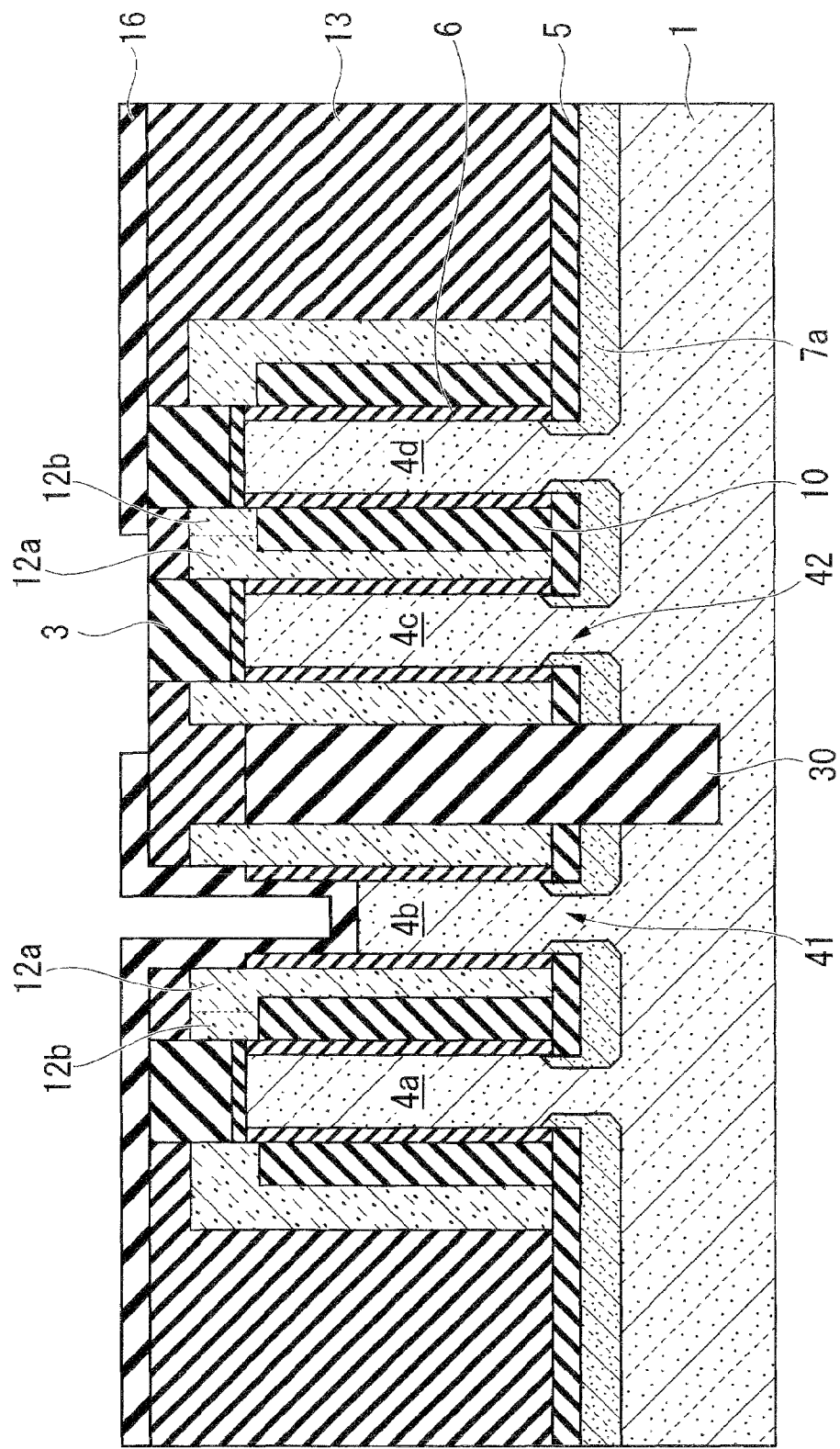

After the silicon oxide film 14 is removed, the silicon oxide film 16 is formed over the first inter-layer insulating film 13 by plasma CVD. Then, the silicon oxide film 16 on the top end of the channel silicon pillar 4c is opened by photolithography and dry-etching so as to expose the surface of the silicon nitride film 3 formed on the top end of the channel silicon pillar 4c as shown in FIG. 15.

Figure 16:
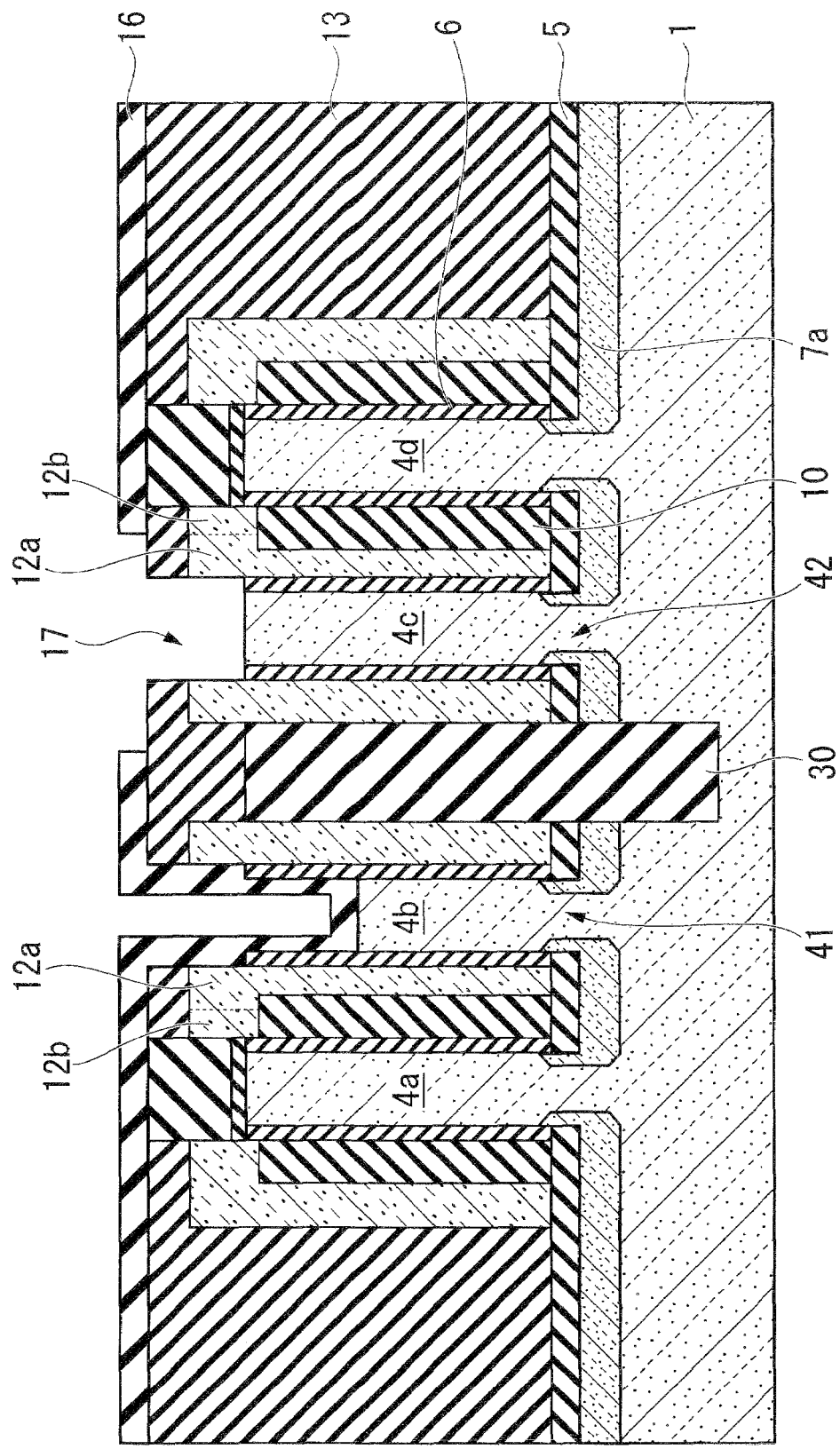

Then, the silicon nitride film 3 and the silicon oxide film 2 on the top end of the channel silicon pillar 4c are removed to form an opening 17 as shown in FIG. 16.

Figure 17:
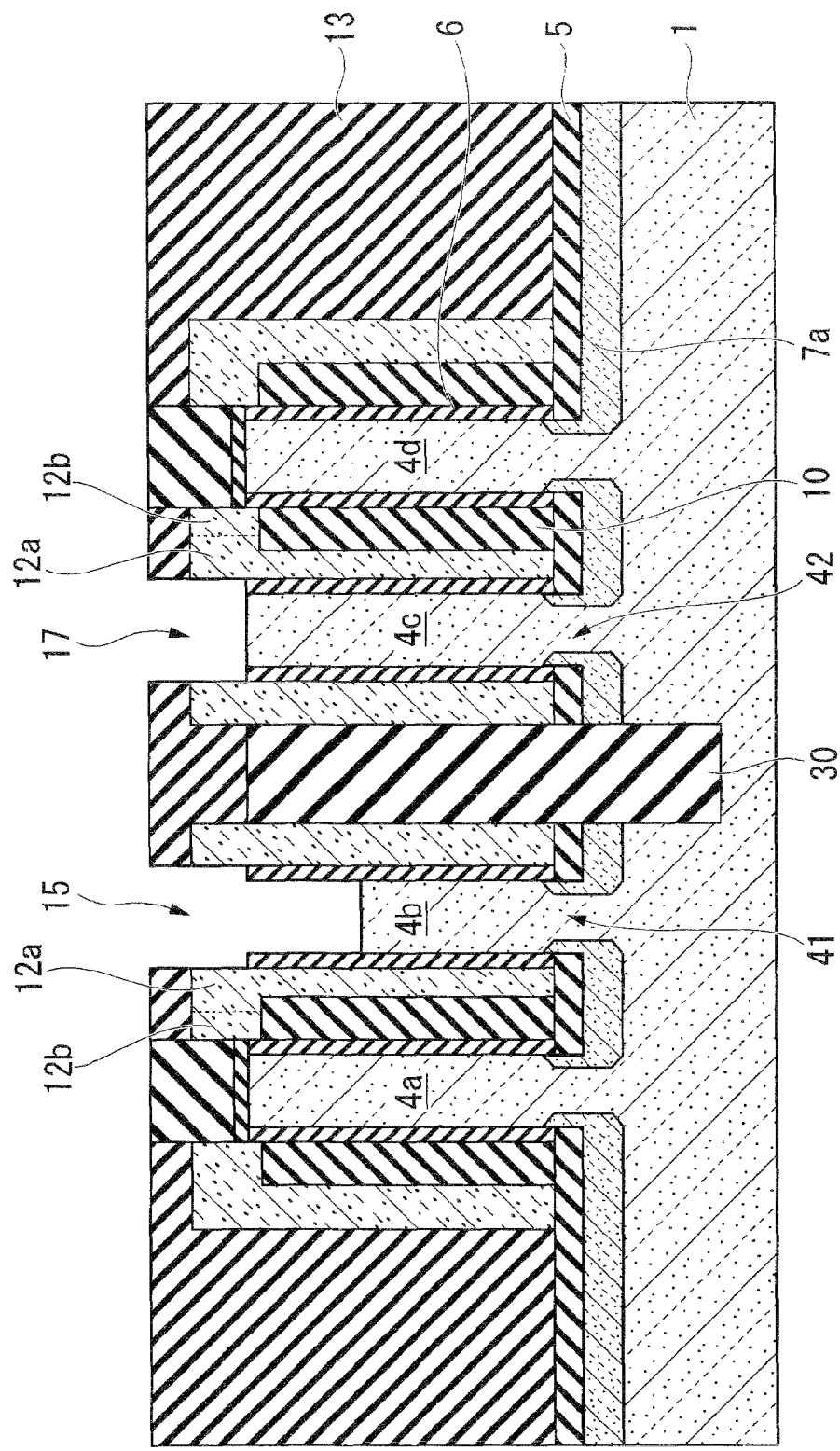

Then, the silicon oxide film 16 is removed as shown in FIG. 17.

Figure 18:
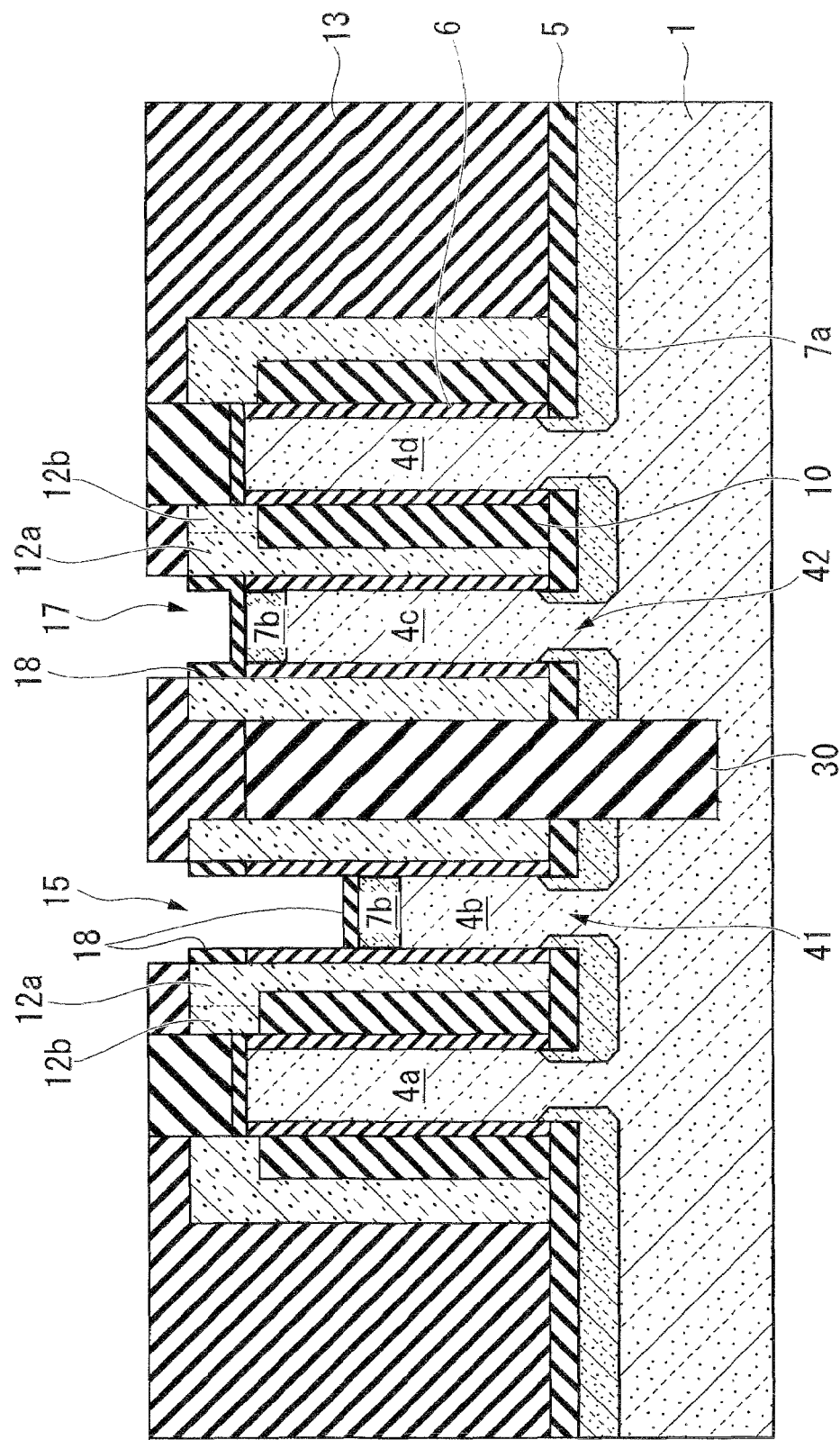

In the process of forming the second semiconductor regions, silicon oxide films 18 are formed by thermal oxidation on exposed side portions of the gate electrodes 12 and the exposed top surfaces of the channel silicon pillars 4b and 4c as shown in FIG. 18.

Then, the second semiconductor regions 7b of the second conductive type are formed on the top ends of the channel silicon pillars 4b and 4c by ion injection and thermal treatment.

Figure 19:
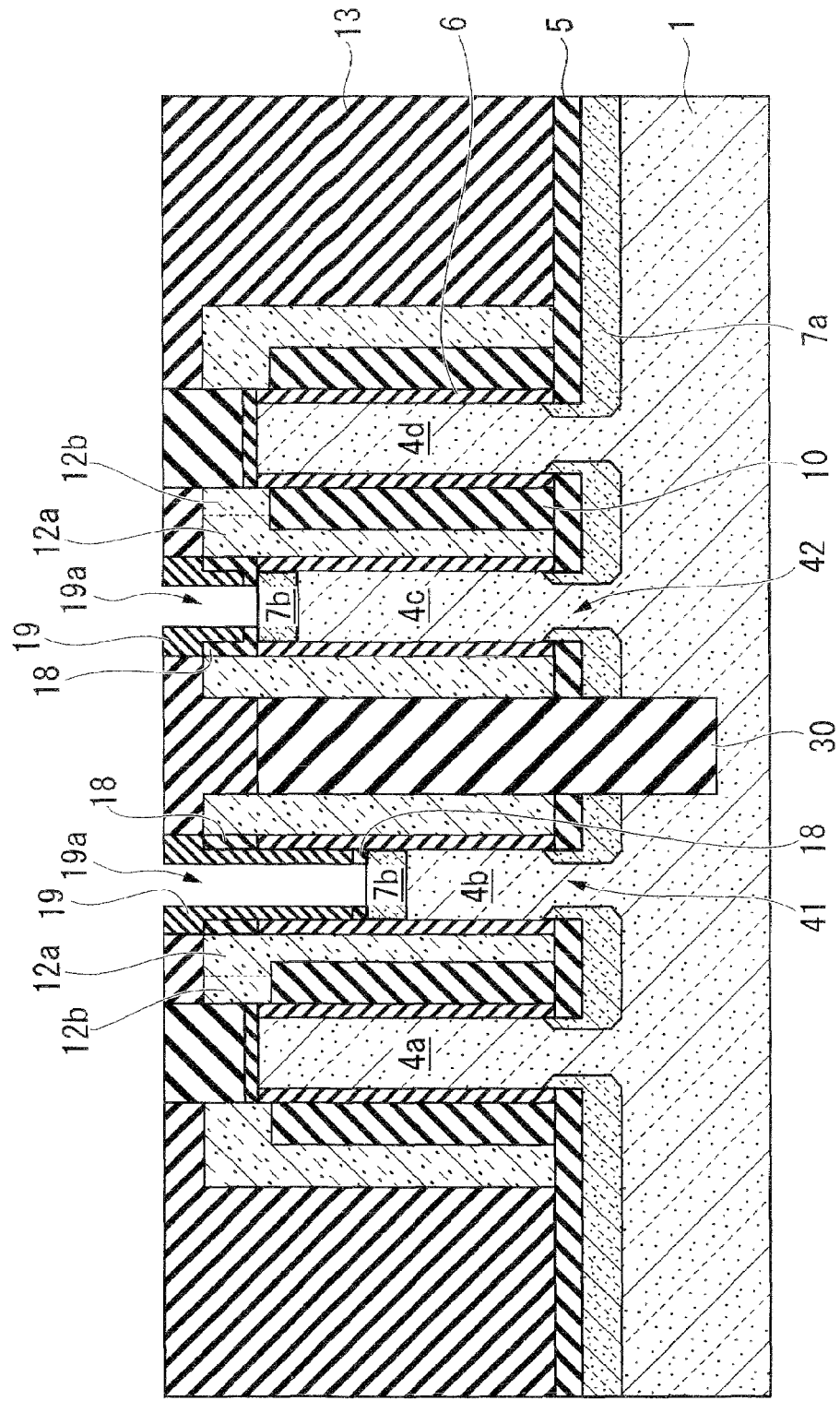

In the process of forming the side spacers and the epitaxial silicon layers, the cylindrical side spacers 19 are formed on the top ends of the channel silicon pillars 4b and 4c by a silicon nitride film being deposited and etched back as shown in FIG. 19. Then, the silicon oxide films 18 formed on the exposed top surfaces of the silicon pillars 4b and 4c are removed. As a result, the silicon oxide films 18 that are not removed remain under the cylindrical side spacers 19.

The cylindrical side spacers 19 have through holes 19a.

Figure 20:
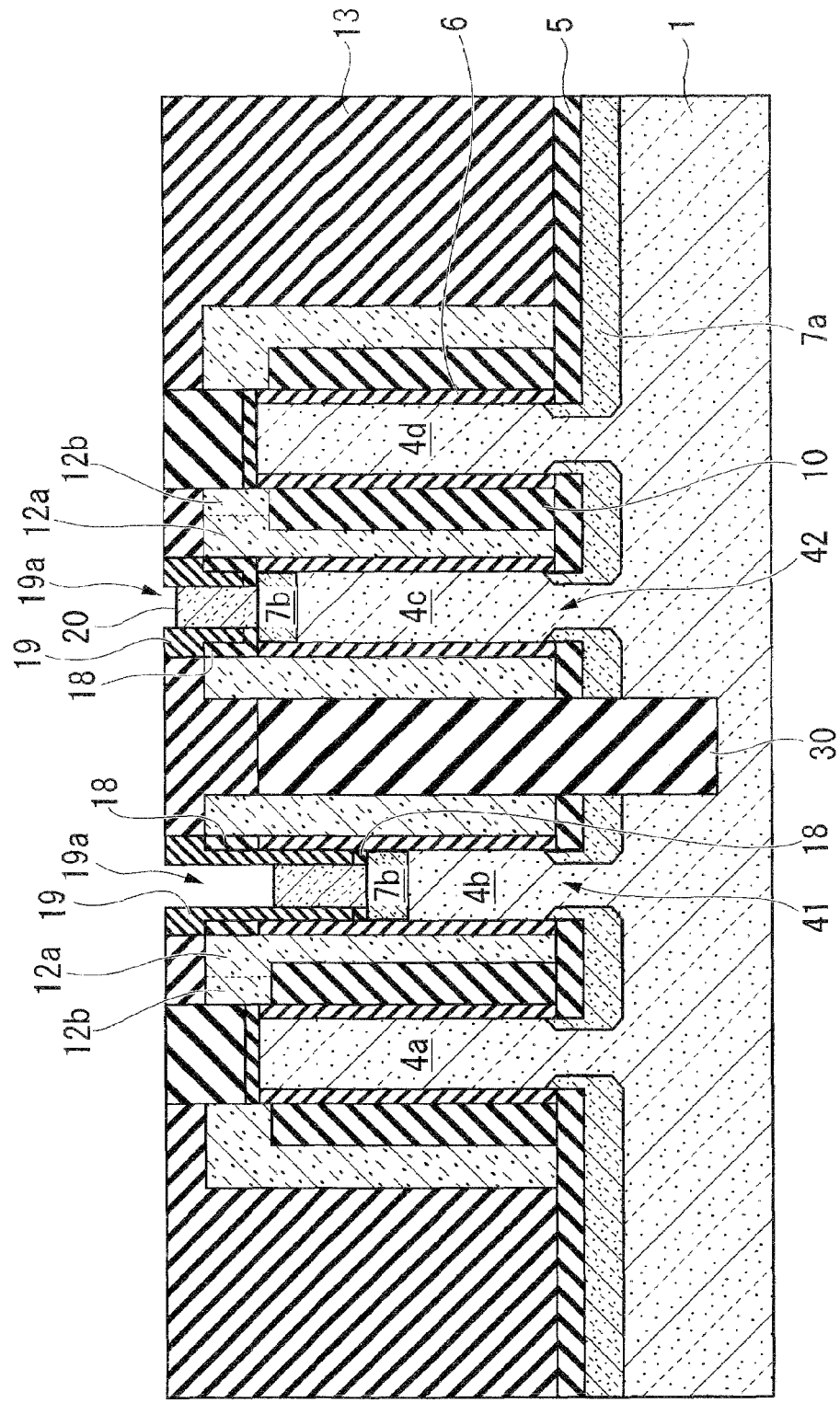

The epitaxial silicon layers 20 are formed so as to fill up the holes 19a of the cylindrical side spacers 19 to a given height as shown in FIG. 20.

Figure 21:
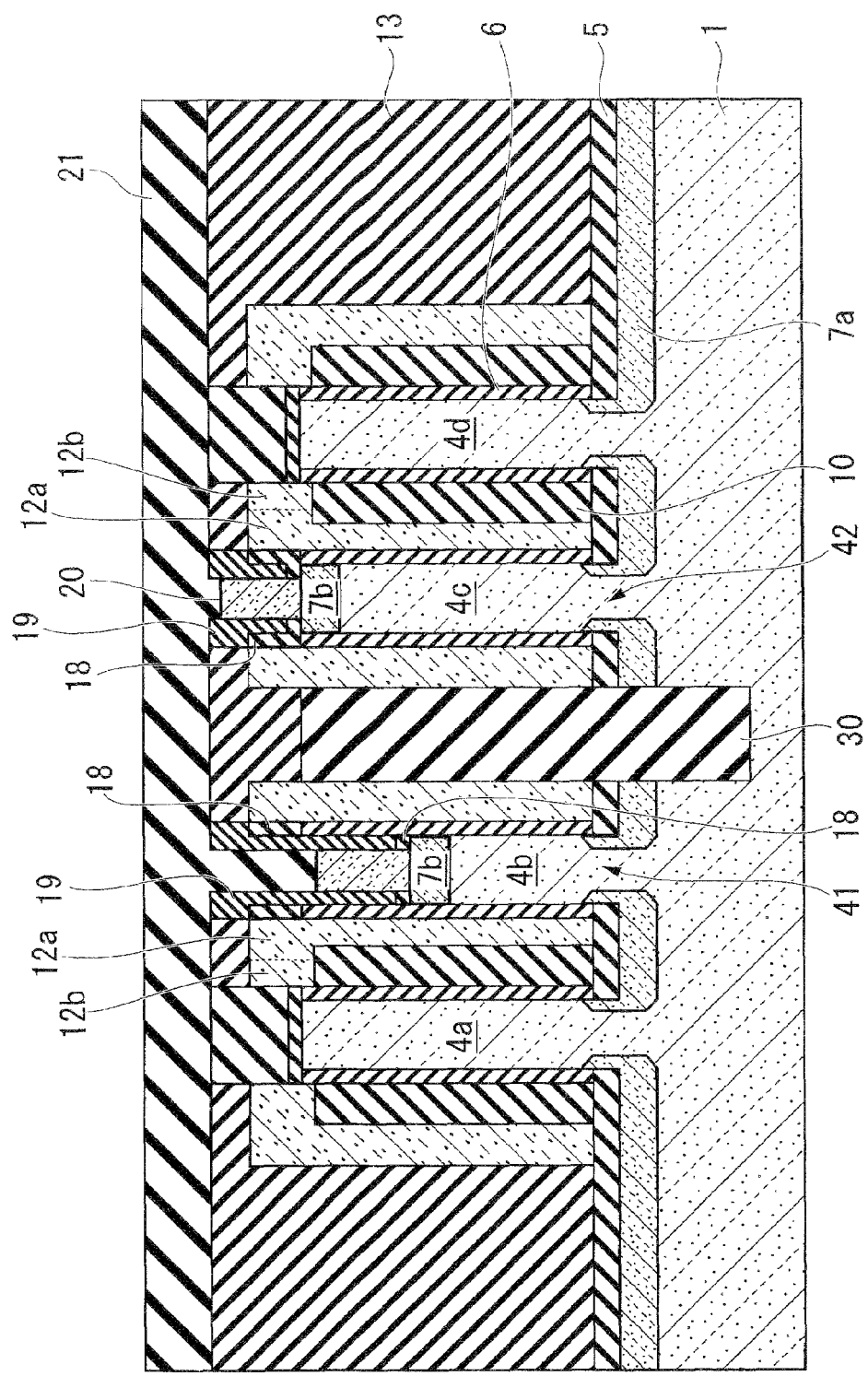

In the process of forming the contact plug electrodes, the second inter-layer insulating film 21 made of a silicon oxide film is deposited by CVD so as to cover the first inter-layer insulating film 13 and to fill the holes 19a of the side spacers 19 as shown in FIG. 21.

Lastly, contact plug holes are provided on the first inter-layer insulating film 13, the second inter-layer insulating film 21, and the silicon oxide film 5 as shown in FIG. 2. Then, the contact plug electrodes 22 to 27 are formed so as to fill up the contact plug holes. Thereby, the semiconductor device 100 including the vertical MOS transistor Tr1 of the short channel length d1 and the vertical MOS transistor Tr2 of the long channel length d2 is completed.

The method of manufacturing the semiconductor device 100 includes the process of forming the sacrificial insulating film 8 over the insulating film 6 by SOG after forming the insulating films 6 on the silicon pillars 4a to 4d. Accordingly, the sacrificial insulating film 8 provided on the circumferences of the silicon pillars 4a and 4d that are not the channel silicon pillars 4b and 4c among the silicon pillars 4a to 4d can be removed. Then, the capacitance-increase-prevention insulating film 10 can be formed on the removed portions to form the gate-voltage-supply silicon pillars 4a and 4d. Then, the residual portions of the sacrificial insulating film 8 can be removed to form the gate insulating films 11 on the circumferences of the channel silicon pillars 4b and 4c. Therefore, the gate-voltage-supply silicon pillars 4a and 4d and the channel silicon pillars 4b and 4c can selectively be formed. As a result, the semiconductor device 100 including the vertical MOS transistors Tr1 and Tr2 of different channel lengths can easily be manufactured, and the manufacturing processes can be simplified.

The method of manufacturing the semiconductor device 100 includes the processes of forming the capacitance-increase-prevention insulating films 10 surrounding the gate-voltage-supply electrodes 4a and 4d, forming the gate insulating films 11 surrounding the gate electrodes 12a, and connecting the gate-voltage-supply electrodes 12b and the gate electrodes 12a. Therefore, the structure can easily be formed in which voltages can be applied from the contact plug electrodes 27 and 24 above the gate voltage-supply electrodes 4a and 4d to the gate electrodes 12a of the vertical MOS transistors Tr1 and Tr2 of different channel lengths. Further, the forming processes can be simplified.

The method of manufacturing the semiconductor device 100 includes the process of lowering the height of the channel silicon pillar 4b by etching after exposing the top ends of at least one of the channel silicon pillars 4b and 4c (channel silicon 4b in the first embodiment). Therefore, the channel silicon pillars 4b and 4c of different heights can easily be formed. As a result, the semiconductor device 100 including the vertical MOS transistors Tr1 and Tr2 of different channel heights can easily be formed. Further, the manufacturing processes can be simplified.

The method of manufacturing the semiconductor device 100 includes the processes of forming the cylindrical side spacers 19 on the exposed top ends of the channel silicon pillars 4b and 4c, forming the epitaxial silicon layers 20 so as to fill up the holes 19a of the side spacers 19, and then forming the contact plug electrodes 25 and 22. Therefore, the structure can easily be formed in which insulation of the gate electrodes 12a from the contact plug electrodes 25 and 22 and epitaxial films 20 that supply voltages to the second semiconductor regions 7b of the second conductive type of the vertical MOS transistors Tr1 and Tr2 is ensured.

Second Embodiment

Figure 22:
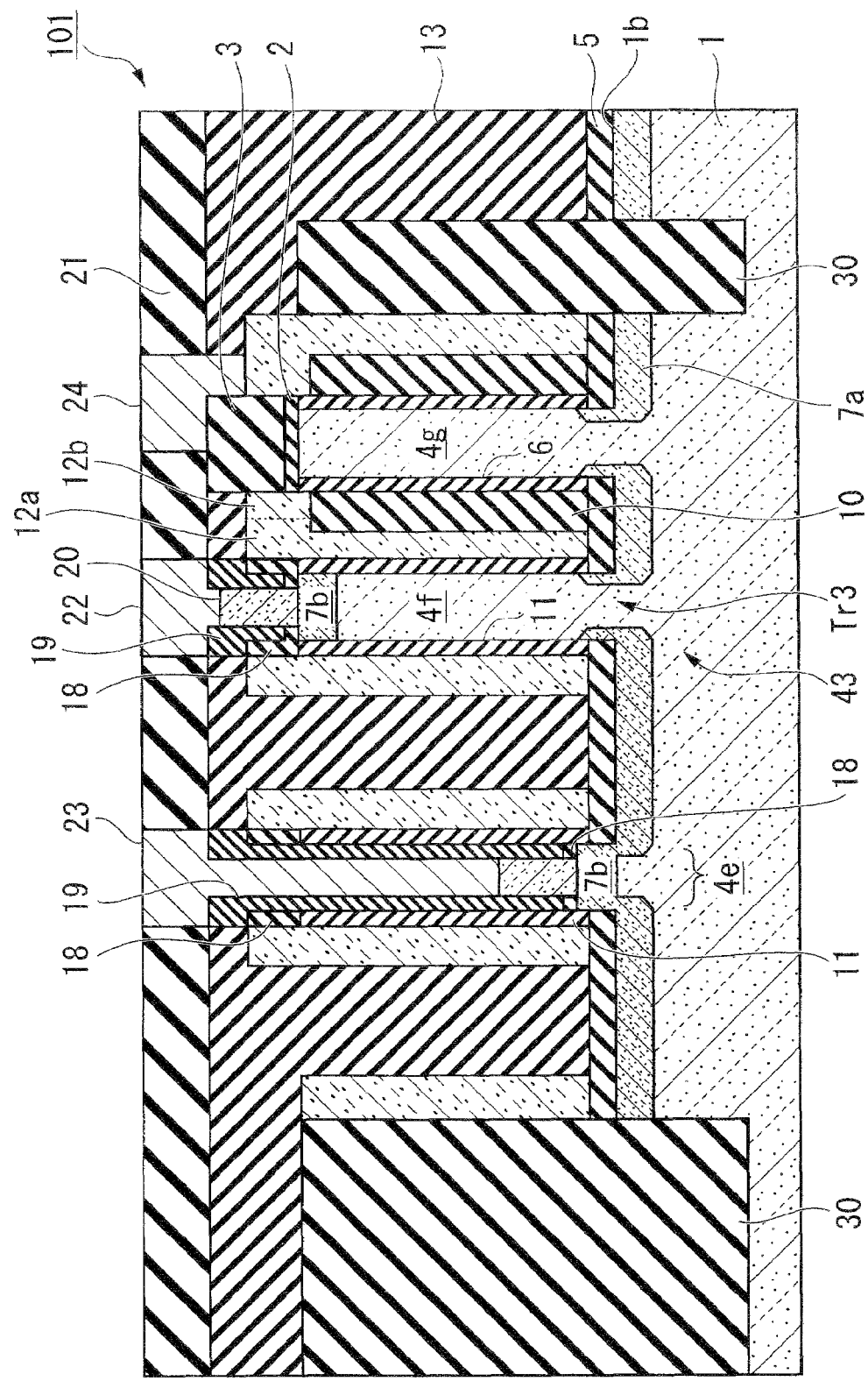
FIG. 22 is a cross-sectional view of a semiconductor device according to a second embodiment of the present invention.

FIG. 22 is a cross-sectional view showing a semiconductor device according to a second embodiment of the present invention. Like reference numerals represent like elements of the first embodiment.

In a semiconductor device 101 according to the second embodiment, first semiconductor regions 7a of the second conductive type that are to be a source and a drain are formed on the bottom end of a channel silicon pillar 4f serving as a channel in the first-conductive-type active region 43 formed by the shallow-trench isolation region 30 formed on the semiconductor substrate 1 dividing the semiconductor substrate 1. The second semiconductor region 7b of the second conductive type is formed on the top end of the channel silicon pillar 4f. The gate insulating film 11 is formed to surround the channel silicon pillar 4f. The gate insulating film 11 is surrounded by the gate electrode 12a. Thus, the vertical MOS transistor Tr3 is formed.

A source-drain-voltage-supply silicon pillar 4e, the channel silicon pillar 4f, and a gate-voltage-silicon pillar 4g are formed in the active region 43.

A height of the source-drain-voltage-supply silicon pillar 4e is lowered close to the plane surface 1b of the semiconductor substrate 1. On the bottom end of the source-drain-voltage-supply silicon pillar 4e, the second semiconductor region 7b of the second conductive type is formed in contact with the first semiconductor region 7a of the second conductive type.

The epitaxial film 20 is formed on the top end of the source-drain-voltage-supply silicon pillar 4e and connected to the contact plug electrode 23. Accordingly, the contact plug electrode 23 can supply a voltage to the first semiconductor region 7a of the second conductive type through the epitaxial film 20 and the second semiconductor region 7b of the second conductive type. Since the first semiconductor region 7a of the second conductive type extends to the bottom end of the channel silicon pillar 4f, the supplied voltage can be a source-drain voltage of the vertical MOS transistor Tr3.

The channel silicon pillar 4f has the same structure as those of the channel silicon pillars 4b and 4c.

The epitaxial film 20 is formed on the top end of the channel silicon pillar 4f and connected to the contact plug electrode 22. Accordingly, the contact plug electrode 22 can supply a voltage to the second semiconductor region 7b of the second conductive type through the epitaxial film 20.

The gate-voltage-supply silicon pillar 4g has the same structure as those of the gate voltage-supply pillars 4a and 4d in the first embodiment.

The gate-voltage-supply silicon pillar 4g is surrounded by the gate voltage-supply electrode 12b connected to the gate electrode 12a surrounding the channel silicon pillar 4f. The gate voltage-supply electrode 12b is connected to the contact plug electrode 24. Accordingly, the contact plug electrode 24 can supply a voltage to the gate electrode 12a through the gate voltage-supply electrode 12b.

The gate voltage-supply electrode 12b surrounds the capacitance-increase-prevention insulating film 10 surrounding the insulating film 6 surrounding the gate-voltage-supply silicon pillar 4g. The capacitance-increase-prevention insulating film 10 is thicker than the insulating film 6. Therefore, insulation of the gate electrode 12a from the gate-voltage-supply silicon pillar 4g can be ensured, and a voltage can stably be supplied to the gate electrode 12a.

In the semiconductor device 101, the source-drain-voltage-supply silicon pillar 4e is formed in the active region 43, and the second semiconductor region 7b of the second conductive type formed on the top end thereof is connected to the first semiconductor region 7a of the second conductive type. As a result, a voltage can be supplied to the first semiconductor region 7a of the second conductive type through the epitaxial film 20 and the source-drain-voltage-supply silicon pillar 4e. Therefore, there is no need to form a contact plug electrode for supplying a voltage to the first semiconductor region 7a of the second conductive type, and thereby the manufacturing processes can be simplified. Additionally, microscopic contact arrangement is enabled, and thereby design freedom can be enhanced.

Hereinafter, a method of manufacturing the semiconductor device 101 according to the second embodiment is explained. Explanations of processes similar to those explained in the first embodiment are omitted.

The difference is in that contact plug electrodes for supplying voltages to the first semiconductor regions 7a of the second conductive type to be a source and a drain are not formed, and the source-drain-voltage silicon pillar 4e is formed instead. The source-drain-voltage silicon pillar 4e is changed in height to be close to the plane surface 1b of the semiconductor substrate so that the second semiconductor region 7b of the second conductive type can be formed by the ion-injection so as to be in contact with the first semiconductor region 7a of the second conductive type.

The method of manufacturing the semiconductor device 101 includes processes of forming the active regions, the shallow-trench isolation regions, and the silicon pillars; forming the first semiconductor regions; forming a sacrificial insulating layer by SOG after forming the insulating film; forming the gate-voltage-supply silicon pillars after forming the capacitance-increase-prevention insulating film; forming a gate insulating film after removing the sacrificial insulating film; forming the first inter-layer insulating film after forming the gate electrodes; lowering the height of the source-drain-voltage-supply silicon pillar; forming the second semiconductor regions; forming the side spacers and the epitaxial silicon layers; and forming the contact plug electrodes.

In the process of forming the active regions, the shallow-trench isolation regions, and the silicon pillars, the active region 43 of the first conductive type is formed similarly to the first embodiment. Then, the silicon oxide film 2 is formed over a surface 1a of the semiconductor substrate 1 by thermal oxidation. Then, the silicon nitride film 3 is formed over the silicon oxide film 2 by CVD.

Then, the silicon nitride film 3 is patterned by lithography and dry-etching, the silicon oxide film 2 and the semiconductor substrate 1 are etched with the silicon nitride film 3 as a mask by dry-etching, and thereby the silicon pillars 4e, 4f, and 4g are formed. The bottom ends of the silicon pillars 4e to 4g on a surface of the semiconductor substrate 1 is a plane surface 1b.

In the process of forming the insulating film after forming the first semiconductor regions, the first semiconductor regions 7a of the second conductive type that will be sources or drains are formed on the plane surface 1b of the semiconductor substrate 1 and the bottom ends of the silicon pillars 4e to 4g by ion-injection and thermal treatment. Then, the silicon oxide film 5 is formed on the plane surface 1b of the semiconductor substrate 1 by CVD. The silicon oxide films 6 are formed on the side surfaces of the silicon pillars 4e to 4g by thermal oxidation.

In the process of forming the sacrificial insulating film by SOG the sacrificial insulating film 8 made of a silicon oxide film is deposited by SOG over the silicon oxide film 5 on the plane surface 1b of the silicon substrate 1 and the silicon pillars 4e to 4g. Then, the surface of the sacrificial insulating film 8 is planarized by CMP so as to expose the surface of the silicon nitride film 3.

In the process of forming the gate-voltage-supply silicon pillars after forming the capacitance-increase-prevention insulating film, the sacrificial insulating film 8 on peripheral portions 9 of the gate-voltage-supply silicon pillar 4g is removed by lithography and dry-etching. Then, the capacitance-increase-prevention insulating film 10 made of a silicon oxide film is formed by CVD so as to fill up the peripheral portions 9 where the sacrificial insulating film 8 has been removed. Then, the sacrificial insulating film 8 and the capacitance-increase-prevention insulating film 10 are etched back with the silicon nitride film 3 as a mask so as to expose the shallow-trench isolation region 30.

In the process of forming the gate insulating film after removing the sacrificial insulating film, the entire sacrificial insulating film 8 formed by SOG is removed using hydrofluoric acid. After the silicon oxide film 6 is removed, the gate insulating film 11 made of a silicon oxide film is formed on the side surface of the channel silicon pillar 4f by thermal oxidation.

In the process of forming the first inter-layer insulating film after forming the gate electrode, a gate electrode material, such as polysilicon, is deposited by CVD so as to surround the channel silicon pillar 4f, thereby forming the gate electrodes 12a. The gate voltage-supply electrodes 12b are formed so as to surround the gate-voltage-supply silicon pillar 4g. Then, the gate electrodes 12a and the gate voltage-supply electrodes 12b are connected.

Then, the gate electrodes 12a and the gate voltage-supply electrodes 12b are etched back so as to expose the half of the silicon nitride film 3 formed on the top ends of the silicon pillars 4e to 4g.

Then, the first inter-layer insulating film 13 is deposited by high-density plasma CVD and planarized by CMP so as to expose the silicon nitride film 3.

In the process of lowering the height of at least one of the channel silicon pillars, the silicon oxide film 14 is formed over the first inter-layer insulating film 13 by the plasma CVD. Then, the silicon oxide film 14 on the top end of the source-drain-voltage-supply silicon pillar 4e is opened by lithography and dry-etching so as to expose the surface of the silicon nitride film 3 on the top end of the source-drain-voltage-supply silicon pillar 4e.

Then, the silicon nitride film 3 and the silicon oxide film 2 that are on the top end of the source-drain-voltage-supply silicon pillar 4e are removed to form the opening 15.

Then, dry-etching of silicon is performed from the top end of the exposed source-drain-voltage-supply silicon pillar 4e to change the source-drain-voltage-supply silicon pillar 4e in height to be close to the plane surface 1b of the semiconductor substrate 1.

After the silicon oxide film 14 is removed, the silicon oxide film 16 is formed over the first inter-layer insulating film 13 by plasma CVD. Then, the silicon oxide film 16 on the top end of the channel silicon pillar 4f is opened by photolithography and dry-etching so as to expose the surface of the silicon nitride film 3 formed on the top end of the channel silicon pillar 4f.

Then, the silicon nitride film 3 and the silicon oxide film 2 on the top end of the channel silicon pillar 4f are removed to form the opening 17. Then, the silicon oxide film 16 is removed.

In the process of forming the second semiconductor regions, silicon oxide films 18 are formed by thermal oxidation on exposed side portions of the gate electrodes 12 and the exposed top surfaces of the source-drain-voltage-supply silicon pillar 4e and the channel silicon pillar 4f.

Then, the second semiconductor regions 7b of the second conductive type are formed on the top ends of the source-drain-voltage-supply silicon pillar 4e and the channel silicon pillar 4f by ion injection and thermal treatment.

At this time, the source-drain-voltage-supply silicon pillar 4e has been changed in height to be close to the plane surface 1b of the semiconductor substrate 1. Thereby, the second semiconductor region 7b of the second conductive type is formed on the top end of the source-drain-voltage-supply silicon pillar 4e being in contact with the first semiconductor region 7a of the second conductive type formed on the plane surface 1b of the semiconductor substrate 1.

In the process of forming the side spacers and the epitaxial silicon layers, the cylindrical side spacers 19 are formed on the top ends of the source-drain-voltage-supply silicon pillar 4e and the channel silicon pillar 4f by a silicon nitride film being deposited and etched back. Then, the silicon oxide films 18 formed on the exposed top surfaces of the silicon pillars 4e and 4f are removed. As a result, the silicon oxide films 18 that are not removed remain under the cylindrical side spacers 19.

Then, the epitaxial silicon layers 20 are formed so as to fill up the holes 19a of the cylindrical side spacers 19 to a given height.

In the process of forming the contact plug electrodes, the second inter-layer insulating film 21 made of a silicon oxide film is deposited by CVD so as to cover the first inter-layer insulating film 13 and to fill up the holes 19a of the side spacers 19.

Lastly, contact plug holes are provided on the first inter-layer insulating film 13, the second inter-layer insulating film 21, and the silicon oxide film 5 as shown in FIG. 22. Then, the contact plug electrodes 22 to 27 are formed so as to fill up the contact plug holes. Thereby, the semiconductor device 101 including the vertical MOS transistor Tr3 is completed.

According to the method of manufacturing the semiconductor device 101, the height of the source-drain-voltage-supply silicon pillar 4e is lowered so that the second semiconductor region 7b of the second conductive type formed on the top end of the source-drain-voltage-supply silicon pillar 4e is connected to the first semiconductor region 7a of the second conductive type. Therefore, there is no need to form a contact plug electrode for supplying source-drain voltages, thereby simplifying the manufacturing processes.

The present invention relates to a semiconductor device including a vertical MOS transistor and a method of forming the semiconductor device, and is applicable to semiconductor manufacturing-and-utilizing industries.

It is apparent that the present invention is not limited to the above embodiments, but may be modified and changed without departing from the scope and spirit of the invention.

What is claimed is:

1. A method of manufacturing a semiconductor device, comprising:

forming, on a surface of a semiconductor substrate, a plurality of active regions of a first conductive type isolated from one another by shallow-trench isolation regions;

forming a plurality of silicon pillars including channel silicon pillars in the active regions with a silicon nitride film as a mask;

forming first semiconductor regions of a second conductive type on bottom ends of the silicon pillars with the silicon nitride film remaining on the silicon pillars;

forming a sacrificial insulating film by spin coating over the silicon pillars and the semiconductor substrate;

removing the sacrificial insulating film on circumferences of the silicon pillars excluding the channel silicon pillars;

forming capacitance-increase-prevention insulating films on portions where the sacrificial insulating film is removed to form gate-voltage-supply silicon pillars;

removing residuals of the sacrificial insulating film;

forming gate insulating films on circumferences of the channel silicon pillars;

forming gate voltage-supply electrodes surrounding the capacitance-increase-prevention insulating films, and gate electrodes surrounding the gate insulating films so that the gate voltage-supply electrodes and the gate electrodes are connected;

forming a first inter-layer insulating film over the gate voltage-supply electrodes and the gate electrodes;

removing the silicon nitride film on a top end of at least one of the channel silicon pillars so as to expose the one of the channel silicon pillars;

lowering a height of the one of the channel silicon pillars by etching;

exposing top ends of the channel silicon pillars excluding the one of the channel silicon pillars; and forming second semiconductor regions of the second conductive type on the exposed top ends of the channel silicon pillars.

2. The method according to claim 1, further comprising:
forming epitaxial silicon layers on the second semiconductor regions;
forming a second inter-layer insulating film over the first inter-layer insulating film and the epitaxial silicon layers;
forming contact plug holes on the first inter-layer insulating film and the second inter-layer insulating film; and
filling up the contact plug holes to form contact plug electrodes.

3. The method according to claim 1, wherein one of the channel silicon pillars is used as a source-drain-voltage-supply silicon pillar, and the second semiconductor region formed on the top end of the source-drain-voltage-supply silicon pillar is in contact with the first semiconductor region formed on a bottom end of the source-drain-voltage-supply silicon pillar.

4. The method according to claim 2, wherein the contact plug electrodes comprises:
first contact electrodes connected to the first semiconductor regions;
second contact electrodes connected to the second semiconductor regions through the epitaxial silicon layers; and
third contact electrodes connected to the gate voltage-supply electrodes connected to the gate electrodes.

5. The method according to claim 1, wherein the capacitance-increase-prevention insulating films are thicker than the gate insulating films.

6. The method according to claim 2, further comprising forming cylindrical side spacers having holes on the second semiconductor regions before the epitaxial silicon layers are formed.

* * * * *